US007736600B2

(12) United States Patent
Clark et al.

(10) Patent No.: US 7,736,600 B2
(45) Date of Patent: *Jun. 15, 2010

(54) APPARATUS FOR MANUFACTURING A PROCESS ABATEMENT REACTOR

(75) Inventors: Daniel O. Clark, Pleasanton, CA (US); Sebastien Raoux, Santa Clara, CA (US); Robbert M. Vermeulen, Pleasant Hill, CA (US); Shaun W. Crawford, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 617 days.

This patent is subject to a terminal disclaimer.

(21) Appl. No.: 11/555,056

(22) Filed: Oct. 31, 2006

(65) Prior Publication Data

US 2007/0172398 A1  Jul. 26, 2007

Related U.S. Application Data

(60) Provisional application No. 60/731,719, filed on Oct. 31, 2005.

(51) Int. Cl.
*B01D 50/00* (2006.01)
(52) U.S. Cl. ................ 422/171; 422/172; 422/173
(58) Field of Classification Search ........... 422/171, 422/172, 173; 110/238; 431/353
See application file for complete search history.

(56) References Cited

U.S. PATENT DOCUMENTS

| | | | |
|---|---|---|---|
| 2,819,151 A | 1/1958 | Flemmert | |
| 3,185,846 A | 5/1965 | Gilbert et al. | |
| 3,203,759 A | 8/1965 | Flemmert | |
| 3,276,506 A | 10/1966 | Micko | |

(Continued)

FOREIGN PATENT DOCUMENTS

DE  0215706 A1  11/1984

(Continued)

OTHER PUBLICATIONS

Machine Translation JP 2001-82723, Mar. 2001.*

(Continued)

*Primary Examiner*—N. Bhat
(74) *Attorney, Agent, or Firm*—Dugan & Dugan, PC

(57) ABSTRACT

A thermal reactor for use during the abatement of a semiconductor manufacturing process is provided, including a thermal reaction unit having: an interior porous wall that defines a central chamber, the interior porous wall formed from a plurality of stacked porous sections; at least one gas inlet in fluid communication with the central chamber and adapted to introduce gaseous waste stream to the central chamber; a thermal mechanism positioned within the central chamber and adapted to decompose the gaseous waste stream within the central chamber, thereby forming reaction products; and a fluid delivery system adapted to provide a fluid to the central chamber through the interior porous wall at a sufficient force to reduce deposition of reaction products on an inner surface of the interior porous wall of the central chamber; wherein at least one of the porous sections has one or more of: a property that varies within the porous section; and a property that differs from a property of at least one other porous section of the interior porous wall.

25 Claims, 11 Drawing Sheets

U.S. PATENT DOCUMENTS

| | | |
|---|---|---|
| 3,698,696 A | 10/1972 | Rauskolb |
| 3,813,852 A | 6/1974 | Steineke |
| 3,845,191 A | 10/1974 | Bruce et al. |
| 3,898,040 A | 8/1975 | Tabak |
| 3,949,057 A | 4/1976 | Gilbert, Jr. |
| 3,969,482 A | 7/1976 | Teller |
| 3,969,485 A | 7/1976 | Flemmert |
| 3,983,021 A | 9/1976 | Henis |
| 4,011,298 A | 3/1977 | Fukui et al. |
| 4,059,386 A | 11/1977 | Eising |
| 4,083,607 A | 4/1978 | Mott |
| 4,154,141 A | 5/1979 | Sayles |
| 4,172,708 A | 10/1979 | Wu et al. |
| 4,206,189 A | 6/1980 | Kosintsev et al. |
| 4,236,464 A | 12/1980 | Anderson et al. |
| 4,238,460 A | 12/1980 | Aiken et al. |
| 4,243,372 A | 1/1981 | Cade |
| 4,296,079 A | 10/1981 | Hauser |
| 4,374,649 A | 2/1983 | Rao |
| 4,392,821 A | 7/1983 | Füssl et al. |
| 4,479,443 A | 10/1984 | Faldt et al. |
| 4,479,809 A | 10/1984 | Johnson et al. |
| 4,483,672 A | 11/1984 | Wallace et al. |
| 4,519,999 A | 5/1985 | Coleman |
| 4,541,995 A | 9/1985 | Kim et al. |
| 4,555,389 A | 11/1985 | Soneta et al. |
| 4,584,001 A | 4/1986 | Dechene |
| 4,644,877 A | 2/1987 | Barton et al. |
| 4,661,056 A | 4/1987 | Vickery et al. |
| 4,719,088 A | 1/1988 | Itoh et al. |
| 4,753,915 A | 6/1988 | Vogt et al. |
| 4,788,036 A | 11/1988 | Eiselstein et al. |
| 4,801,437 A | 1/1989 | Konagaya et al. |
| 4,834,020 A | 5/1989 | Bartholomew |
| 4,886,444 A | 12/1989 | Hirase et al. |
| 4,908,191 A | 3/1990 | Boldish et al. |
| 4,935,212 A | 6/1990 | Jacob |
| 4,954,320 A | 9/1990 | Birmingham et al. |
| 4,966,611 A | 10/1990 | Schumacher et al. |
| 4,975,098 A | 12/1990 | Lee et al. |
| 4,981,722 A | 1/1991 | Moller et al. |
| 4,986,838 A | 1/1991 | Johnsgard |
| 4,993,358 A | 2/1991 | Mahawili |
| 5,000,221 A | 3/1991 | Palmer |
| 5,009,869 A | 4/1991 | Weinberg et al. |
| 5,011,520 A | 4/1991 | Carr et al. |
| 5,045,288 A | 9/1991 | Raupp et al. |
| 5,045,511 A | 9/1991 | Bosomworth et al. |
| 5,077,525 A | 12/1991 | West et al. |
| 5,113,789 A | 5/1992 | Kamian |
| 5,114,683 A | 5/1992 | Hirase |
| 5,118,286 A | 6/1992 | Sarin |
| 5,122,391 A | 6/1992 | Mayer |
| 5,123,836 A | 6/1992 | Yoneda et al. |
| 5,136,975 A | 8/1992 | Bartholomew et al. |
| 5,137,701 A | 8/1992 | Mundt |
| 5,147,421 A | 9/1992 | Yung |
| 5,151,116 A | 9/1992 | Scholz et al. |
| 5,154,237 A | 10/1992 | Cooper |
| 5,160,707 A | 11/1992 | Murray et al. |
| 5,176,897 A | 1/1993 | Lester |
| 5,183,646 A | 2/1993 | Anderson et al. |
| 5,199,856 A | 4/1993 | Epstein et al. |
| 5,206,003 A | 4/1993 | Imoto et al. |
| 5,207,836 A | 5/1993 | Chang |
| 5,211,729 A | 5/1993 | Sherman |
| 5,213,767 A | 5/1993 | Smith et al. |
| 5,220,940 A | 6/1993 | Palmer |
| 5,238,656 A | 8/1993 | Tajima et al. |
| 5,251,654 A | 10/1993 | Palmer |
| 5,252,007 A | 10/1993 | Klinzing et al. |
| 5,255,709 A | 10/1993 | Palmer |
| 5,255,710 A | 10/1993 | Palmer |
| 5,271,908 A | 12/1993 | Shiban et al. |
| 5,280,664 A | 1/1994 | Lin |
| 5,281,302 A | 1/1994 | Gabric et al. |
| 5,292,704 A | 3/1994 | Lester |
| 5,304,398 A | 4/1994 | Krussell et al. |
| 5,320,124 A | 6/1994 | Palmer |
| 5,361,800 A | 11/1994 | Ewing |
| 5,364,604 A | 11/1994 | Spink et al. |
| 5,393,394 A | 2/1995 | Ikeda et al. |
| 5,407,647 A | 4/1995 | Tarancon |
| 5,417,934 A | 5/1995 | Smith et al. |
| 5,425,886 A | 6/1995 | Smith |
| 5,439,568 A | 8/1995 | Uchiyama |
| 5,450,873 A | 9/1995 | Palmer et al. |
| 5,453,125 A | 9/1995 | Krogh |
| 5,453,494 A | 9/1995 | Kirlin et al. |
| 5,456,280 A | 10/1995 | Palmer |
| 5,494,004 A | 2/1996 | Hunter, Jr. |
| 5,495,893 A | 3/1996 | Roberts et al. |
| 5,510,066 A | 4/1996 | Fink et al. |
| 5,510,093 A | 4/1996 | Bartz et al. |
| 5,527,631 A | 6/1996 | Singh et al. |
| 5,533,890 A | 7/1996 | Holst et al. |
| 5,572,866 A | 11/1996 | Loving |
| 5,575,636 A | 11/1996 | Kobayashi et al. |
| 5,584,959 A | 12/1996 | Kimura et al. |
| 5,589,148 A | 12/1996 | Otsuka et al. |
| 5,597,540 A | 1/1997 | Akita et al. |
| 5,599,508 A | 2/1997 | Martinelli et al. |
| 5,601,790 A | 2/1997 | Stilger et al. |
| 5,603,905 A | 2/1997 | Bartz et al. |
| 5,643,545 A | 7/1997 | Chen et al. |
| 5,649,985 A | 7/1997 | Imamura |
| 5,650,128 A | 7/1997 | Holst et al. |
| 5,663,476 A | 9/1997 | Cripe et al. |
| 5,665,317 A | 9/1997 | Laslo |
| 5,693,293 A | 12/1997 | Reichardt et al. |
| 5,702,999 A | 12/1997 | Mazanec et al. |
| 5,716,428 A | 2/1998 | Imamura |
| 5,720,444 A | 2/1998 | Wheeler et al. |
| 5,720,931 A | 2/1998 | Rossin et al. |
| 5,749,720 A | 5/1998 | Fukuda et al. |
| 5,756,052 A | 5/1998 | Suzumura |
| 5,759,237 A | 6/1998 | Li et al. |
| 5,759,498 A | 6/1998 | Sheu et al. |
| 5,762,893 A | 6/1998 | Scholz et al. |
| 5,779,863 A | 7/1998 | Ha et al. |
| 5,779,998 A | 7/1998 | Tom |
| 5,785,741 A | 7/1998 | Li et al. |
| 5,788,778 A | 8/1998 | Shang et al. |
| 5,790,934 A | 8/1998 | Say et al. |
| 5,800,792 A | 9/1998 | Ibaraki et al. |
| 5,817,284 A | 10/1998 | Nakano et al. |
| 5,833,888 A | 11/1998 | Arya et al. |
| 5,840,897 A | 11/1998 | Kirlin et al. |
| 5,843,239 A | 12/1998 | Shrotriya |
| 5,843,288 A | 12/1998 | Yamamoto |
| 5,855,648 A | 1/1999 | Prasad et al. |
| 5,855,822 A | 1/1999 | Chen |
| 5,858,065 A | 1/1999 | Li et al. |
| 5,865,879 A | 2/1999 | Lee |
| 5,877,391 A | 3/1999 | Kanno et al. |
| 5,891,404 A | 4/1999 | Ibaraki et al. |
| 5,900,217 A | 5/1999 | Hartung et al. |
| 5,914,091 A | 6/1999 | Holst et al. |
| 5,919,285 A | 7/1999 | Li et al. |
| 5,935,283 A | 8/1999 | Sweeney et al. |
| 5,935,540 A | 8/1999 | Otsuka et al. |
| 5,938,422 A | 8/1999 | Smith et al. |
| 5,955,037 A | 9/1999 | Holst et al. |
| 5,957,678 A | 9/1999 | Endoh et al. |

| | | | | | | |
|---|---|---|---|---|---|---|
| 5,965,786 | A | 10/1999 | Rostaing et al. | DE | 4319118 A1 | 12/1994 |
| 5,972,078 | A | 10/1999 | Collins et al. | DE | 4321762 A1 | 1/1995 |
| 5,989,412 | A | 11/1999 | Okagami et al. | DE | 19526737 | 1/1997 |
| 6,007,742 | A | 12/1999 | Czernichowski et al. | EP | 0306540 A1 | 3/1989 |
| 6,009,827 | A | 1/2000 | Robles et al. | EP | 0 360 941 A2 | 4/1990 |
| 6,010,576 | A | 1/2000 | Lin | EP | 0 412 456 A2 | 2/1991 |
| 6,013,584 | A | 1/2000 | M'Saad et al. | EP | 0 597 393 A1 | 5/1994 |
| 6,030,591 | A | 2/2000 | Tom et al. | EP | 0642809 A1 | 3/1995 |
| 6,059,858 | A | 5/2000 | Lin et al. | EP | 0 694 735 A1 | 1/1996 |
| 6,072,227 | A | 6/2000 | Yau et al. | EP | 0 802 370 A2 | 10/1997 |
| 6,095,084 | A | 8/2000 | Shamouilian et al. | EP | 0 809 071 A1 | 11/1997 |
| 6,110,529 | A | 8/2000 | Gardiner et al. | EP | 0 861 683 A2 | 9/1998 |
| 6,153,150 | A | 11/2000 | Moore et al. | EP | 0 885 648 A1 | 12/1998 |
| 6,153,159 | A | 11/2000 | Engeler et al. | EP | 0 916 388 A2 | 5/1999 |
| 6,185,839 | B1 | 2/2001 | Kholodenko et al. | EP | 0 919 773 A1 | 6/1999 |
| 6,187,072 | B1 | 2/2001 | Cheung et al. | EP | 0 933 120 A1 | 8/1999 |
| 6,187,080 | B1 | 2/2001 | Ping-Chung et al. | EP | 1 129 775 A1 | 9/2001 |
| 6,190,507 | B1 | 2/2001 | Whealton et al. | EP | 1 143 197 A1 | 10/2001 |
| 6,217,640 | B1 | 4/2001 | Lu et al. | EP | 1 240 937 A1 | 9/2002 |
| 6,234,787 | B1 * | 5/2001 | Endoh et al. ............ 431/353 | EP | 1 431 657 A1 | 6/2004 |
| 6,261,524 | B1 * | 7/2001 | Herman et al. .............. 422/173 | FR | 2 062 565 | 6/1971 |
| 6,322,756 | B1 | 11/2001 | Arno et al. | GB | 2 028 998 A | 3/1980 |
| 6,338,312 | B2 | 1/2002 | Hayes et al. | JP | 51-129868 | 11/1976 |
| 6,345,768 | B1 | 2/2002 | Inagaki et al. | JP | 57-091725 | 6/1982 |
| 6,361,584 | B1 | 3/2002 | Stevens et al. | JP | 57-117333 | 7/1982 |
| 6,423,284 | B1 | 7/2002 | Arno et al. | JP | 58-045718 | 3/1983 |
| 6,464,944 | B1 | 10/2002 | Moore et al. | JP | 59-082927 | 5/1984 |
| 6,468,490 | B1 | 10/2002 | Shamouilian et al. | JP | 61-021717 | 1/1986 |
| 6,491,884 | B1 | 12/2002 | Faller et al. | JP | 61-200851 | 9/1986 |
| 6,494,711 | B1 | 12/2002 | Takemura et al. | JP | 62-273039 | 11/1987 |
| 6,511,641 | B2 | 1/2003 | Herman et al. | JP | 63-062528 | 3/1988 |
| 6,527,828 | B2 | 3/2003 | Flippo et al. | JP | 02-068414 | 3/1990 |
| 6,544,482 | B1 | 4/2003 | Inori | JP | 02-102719 | 4/1990 |
| 6,551,381 | B2 * | 4/2003 | Flippo et al. .................... 95/54 | JP | 02 225905 A | 9/1990 |
| 6,655,137 | B1 | 12/2003 | Sardari | JP | 3-9768 | 2/1991 |
| 6,712,603 | B2 | 3/2004 | Pettit | JP | 03-047516 | 2/1991 |
| 6,736,635 | B1 | 5/2004 | Takemura et al. | JP | 91009768 | 2/1991 |
| 6,805,728 | B2 | 10/2004 | Sweeney et al. | JP | 03-065218 | 3/1991 |
| 6,813,943 | B2 | 11/2004 | Smith et al. | JP | 03-262523 | 11/1991 |
| 6,824,748 | B2 | 11/2004 | Kaushal et al. | JP | 04-050422 | 2/1992 |
| 6,843,830 | B2 | 1/2005 | Sherer | JP | 04-209524 | 10/1992 |
| 6,875,007 | B2 | 4/2005 | Pettit | JP | 05-192534 | 8/1993 |
| 6,946,107 | B2 | 9/2005 | Carlborg et al. | JP | 05-296979 | 11/1993 |
| 6,969,250 | B1 | 11/2005 | Kawamura et al. | JP | 06-063357 | 3/1994 |
| 7,047,893 | B2 | 5/2006 | Loving | JP | 06-137537 | 5/1994 |
| 7,160,521 | B2 | 1/2007 | Porshnev et al. | JP | 06 313532 A | 11/1994 |
| 7,316,721 | B1 | 1/2008 | Redden et al. | JP | 07-010335 | 1/1995 |
| 2001/0001652 | A1 | 5/2001 | Kanno et al. | JP | 07-323211 | 12/1995 |
| 2001/0032543 | A1 | 10/2001 | Seeley et al. | JP | 08-309146 | 11/1996 |
| 2001/0055555 | A1 | 12/2001 | Herman et al. | JP | 08-333453 | 12/1996 |
| 2002/0066535 | A1 | 6/2002 | Brown et al. | JP | 09 133333 A | 5/1997 |
| 2002/0110500 | A1 | 8/2002 | Moore et al. | JP | 10-192653 | 7/1998 |
| 2002/0159924 | A1 | 10/2002 | Arno et al. | JP | 11-070322 | 3/1999 |
| 2002/0182131 | A1 | 12/2002 | Kaushal et al. | JP | 11-276860 | 10/1999 |
| 2004/0028590 | A1 | 2/2004 | Tsuji et al. | JP | 11-319485 | 11/1999 |
| 2004/0065013 | A1 | 4/2004 | DeVries | JP | 11-335164 | 12/1999 |
| 2004/0161718 | A1 | 8/2004 | Pettit | JP | 2000-108245 | 4/2000 |
| 2004/0191146 | A1 | 9/2004 | Shinohara et al. | JP | 2001-082723 * | 3/2001 |
| 2004/0213721 | A1 | 10/2004 | Arno et al. | JP | 2001082723 A | 3/2001 |
| 2004/0216610 | A1 | 11/2004 | Tom et al. | KR | 1999-007143 | 1/1999 |
| 2004/0237781 | A1 | 12/2004 | Terada et al. | WO | WO 96/16720 A1 | 6/1996 |
| 2005/0135984 | A1 | 6/2005 | Ferron | WO | WO 9749479 A1 | 12/1997 |
| 2006/0024226 | A1 | 2/2006 | Park et al. | WO | WO 98/29181 A1 | 7/1998 |
| 2006/0104879 | A1 | 5/2006 | Chiu et al. | WO | WO 99/02921 A1 | 1/1999 |
| 2007/0169889 | A1 | 7/2007 | Clark et al. | WO | WO 99/61132 A1 | 2/1999 |
| 2007/0172399 | A1 | 7/2007 | Clark et al. | WO | WO 00/09258 A1 | 2/2000 |
| 2007/0190469 | A1 | 8/2007 | Clark et al. | WO | WO 00/67879 A1 | 11/2000 |
| 2007/0274876 | A1 | 11/2007 | Chiu et al. | WO | WO 01/78873 A1 | 10/2001 |
| 2009/0010816 | A1 | 1/2009 | Ferron et al. | WO | WO 2004/031073 A2 | 4/2004 |
| | | FOREIGN PATENT DOCUMENTS | | WO | WO 2005/062772 | 7/2005 |
| DE | | 4311061 A1 | 10/1994 | WO | WO 2006/053231 | 11/2006 |

| WO | WO 2007/053626 | 12/2007 |

OTHER PUBLICATIONS

International Search Report and Written Opinion of PCT/US06/42501 (10697-PCT) mailed on Oct. 31, 2007.
9984/PCT/EPC (App. No. 04814510.6) Search Report dtd Jan. 5, 2009.
9985/PCT (PCT/US05/040960) ISR&WO dated Aug. 14, 2006.
ISR& WrO dtd Nov. 16, 2006 [PCT/US2004/042334 (9984/PCT)].
Office Action of Chines Patent Application No. 200480038033.X (9984/PCT/CHI) dated Jul. 25, 2008.
Office Action of Malaysia Patent Application No. PI 20045188 (9984/PCT/MAYS) dated Mar. 19, 2008.
Abreu, et al. Causes of anomalous solid formation in the exhaust system of low-pressure chemical vapor deposition plasma enhanced chemical vapor deposition semiconductor processes, J. Vac. Sci. Technol B 12(4) Jul./Aug. 1994, pp. 2763/2767.
Cady, George Hamilton, "Reaction of Fluorine with Water and with Hydroxides", Feb. 1935, J. J. Am. Chem. Soc., vol. 57, pp. 246-249.
Catalytic Decomposition System, Hitachi America, Ltd. Semiconductor Equipment Group-SCDS Gas Abatement Systems, <http://www.hitachi.com/semiequipment/productsscds.html>, pp. 1-2, printed on Apr. 21, 1999.
Environmental—Complete system solutions for air pollution control (Brochure—<http://www.olpidurr.com/e/images/environmental2001.pdf>), Dürr Environmental, Inc. <http://www.olpidurr.com/e/eco/ecopage.htm>, pp. 1-12.
Fenwal Test Detonation Arresting System at NMERI Site, May 1992 test of Fenwal Detonation Arresting System at New Mexico Engineering Research Institute.
Hardwick, Steven J., et al., "Waste Minimization in Semiconductor Processing", 1994, Mater. Res. Soc. Symp. Proc., vol. 344, pp. 273-278.
Hayakawa, Saburo, "Silane Gas Scrubber", Koatsu Gasu, 24(7), p. 371-9, (1987).
Holmes, John T., et al., "Fluidized Bed Disposal of Fluorine", Oct. 1967, I&EC Process Design and Development, vol. 6, No. 4, pp. 408-413.

Kanken Techno detoxifier KT 1000 Venus, Crystec Technology Trading GmbH, <http://www.crystec.com/ktcvenue.htm>, pp. 1-4, printed on Jul. 27, 1999.
Landau, Ralph, et al., "Industrial handling of FLOURINE", Mar. 1947, Industrial and Engineering Chemistry, vol. 39, No. 3, pp. 281-286.
Langan, John., et al., "Strategies for greenhouse gas reduction", Jul. 1996, Solid State Technology, pp. 115-119.
M. Brinkmann et al., "Unsteady State Treatment of Very Lean Waste Gases in a Network of Catalytic Burners", 1999, Elsevier Science B. V.—Catalysis Today 47, pp. 263-277.
Slabey, Vernon A., et al., "Rate of Reaction of Gaseous Fluorine with Water Vapor at 35° C.", (1958), National Advisory Committee for Aeronautics, Technical Note 4374, pp. 1-16.
Smiley, et al. "Continuous Disposal of Fluorine", Industrial and Engineering Chemistry, 1954, vol. 46, No. 2, pp. 244-247.
Streng, A. G., "The Fluorine-Steam Flame and Its Characteristics", Jun. 1962, Combustion Flame, vol. 6, pp. 89-91.
Turnbull, S. G., et al., "Analysis and Disposal of Fluorine", Industrial and Engineering Chemistry, Mar. 1947, vol. 39, No. 3, pp. 286-288.
"Integrated Thermal/Wet: CVD Effluent Treatment System", 2002, pp. 1-2, ATMI, Inc., San Jose, CA.
Viswanath et al., "Preparation and study of YSTZ-AL2O3 nanocomposites", Journal of Materials Science, 1999, pp. 2879-2886, vol. 34, Kluwer Academic Publishers.
Vedula et al, "Test Methodology for the thermal shock characterization of ceramics", Journal of Materials Science, 1998, pp. 5427-5432, vol. 33, Kluwer Academic Publishers.
International Preliminary Report on Patentability of International Application No. PCT/US2006/042501 (10697-PCT) mailed May 15, 2008.
Fu et al., "Measurement and correlation of volumetric heat transfer coefficieients of cellular ceramics", Experimental Thermal and Fluid Science, 1998, pp. 285-293, vol. 17, Elsevier Science Inc.

* cited by examiner

APPARATUS FOR MANUFACTURING A PROCESS ABATEMENT REACTOR

The present application claims priority from U.S. Provisional Patent Application Ser. No. 60/731,719, filed Oct. 31, 2005, which is hereby incorporated by reference herein in its entirety.

FIELD OF THE INVENTION

The present invention relates to improved systems and methods for the abatement of industrial effluent fluids, such as effluent gases produced in semiconductor manufacturing processes, while reducing the deposition of reaction products in the abatement systems.

BACKGROUND

The gaseous effluents from the manufacturing of semiconductor materials, devices, products and memory articles involve a wide variety of chemical compounds used and produced in the process facility. These compounds include inorganic and organic compounds, breakdown products of photoresist and other reagents, and a wide variety of other gases that must be removed from the waste gas before being vented from the process facility into the atmosphere.

Semiconductor manufacturing processes utilize a variety of chemicals, many of which have extremely low human tolerance levels. Such materials include gaseous hydrides of antimony, arsenic, boron, germanium, nitrogen, phosphorous, silicon, selenium, silane, silane mixtures with phosphine, argon, hydrogen, organosilanes, halosilanes, halogens, organometallics and other organic compounds.

Halogens, e.g., fluorine ($F_2$) and other fluorinated compounds, are particularly problematic among the various components requiring abatement. The electronics industry uses perfluorinated compounds (PFCs) in wafer processing tools to remove residue from deposition steps and to etch thin films. PFCs are recognized to be strong contributors to global warming and the electronics industry is working to reduce the emissions of these gases. The most commonly used PFCs includes but are not limited to, $CF_4$, $C_2F_6$, $SF_6$, $C_3F_8$, $C_4H_8$, $C_4H_8O$ and $NF_3$. In practice, these PFCs are dissociated in a plasma to generate highly reactive fluoride ions and fluorine radicals, which do the actual cleaning and/or etching. The effluent from these processing operations include mostly fluorine, silicon tetrafluoride ($SiF_4$), hydrogen fluoride (HF), carbonyl fluoride ($COF_2$), $CF_4$ and $C_2F_6$.

Improved methods and apparatus for abating such effluent streams are desired.

SUMMARY OF THE INVENTION

In certain embodiments, a thermal reactor is provided for use during the abatement of a semiconductor manufacturing process. The thermal reactor includes a thermal reaction unit having (a) an interior porous wall that defines a central chamber, the interior porous wall formed from a plurality of stacked porous sections; (b) at least one waste gas inlet in fluid communication with the central chamber and adapted to introduce a gaseous waste stream to the central chamber; (c) a thermal mechanism positioned within the central chamber and adapted to decompose the gaseous waste stream within the central chamber, thereby forming reaction products; and (d) a fluid delivery system adapted to provide a fluid to the central chamber through the interior porous wall at a sufficient force to reduce deposition of reaction products on an inner surface of the interior porous wall of the central chamber. At least one of the porous sections has one or more of (i) a property that varies within the porous section; and (ii) a property that differs from a property of at least one other porous section of the interior porous wall.

In certain embodiments, a replacement part is provided for use in an abatement system. The replacement part includes a stackable and replaceable porous chamber section having a plurality of features that allow the porous chamber section to be stacked with other porous chamber sections so as to form a porous wall that defines a central chamber for use during decomposition of gaseous waste from a semiconductor manufacturing process. The porous chamber section has sufficient porosity to allow transfer of fluid from outside the porous chamber section through the porous chamber section and into the central chamber during a decomposition process performed within the central chamber so as to reduce movement of reaction products toward an interior surface of the porous chamber section. The porous chamber section has a shape selected from the group consisting of round, elliptical, triangular, square, rectangular, polygonal, pentagonal, hexagonal and octagonal. Further, the porous chamber section has one or more of (a) a property that varies within the porous chamber section; and (b) a property that differs from a property of at least one other porous chamber section of the porous wall.

In certain embodiments, an apparatus is provided for use in removing pollutants from a gas stream. The apparatus includes a thermal reaction unit formed from a plurality of stacked porous ceramic rings. A first of the porous ceramic rings has a first coefficient of thermal expansion (CTE) and a second of the porous ceramic rings has a second CTE.

In certain embodiments, an apparatus is provided for use in removing pollutants from a gas stream. The apparatus includes a thermal reaction unit formed from a plurality of stacked porous ceramic rings. A first of the porous ceramic rings has a first purity level and a second of the porous ceramic rings has a second purity level.

In certain embodiments, an apparatus is provided for use in removing pollutants from a gas stream. The apparatus includes a thermal reaction unit formed from a plurality of stacked porous ceramic rings. A first of the porous ceramic rings has a first dopant level and a second of the porous ceramic rings has a second dopant level.

In certain embodiments, an apparatus is provided for use during the abatement of a semiconductor manufacturing process. The apparatus includes a thermal reaction unit having (a) an exterior wall having a plurality of perforations adapted to pass of a fluid therethrough; (b) an interior porous wall that defines a central chamber, the interior porous wall formed from a plurality of stacked porous sections; (c) at least one waste gas inlet in fluid communication with the central chamber and adapted to introduce a gaseous waste stream to the central chamber; (d) a thermal mechanism positioned within the central chamber and adapted to decompose the gaseous waste stream within the central chamber, thereby forming reaction products; and (e) a fluid delivery system adapted to provide a fluid through the perforations of the exterior wall and to the central chamber through the interior porous wall at a sufficient force to reduce deposition of reaction products on an inner surface of the interior porous wall of the central chamber. The perforations in the exterior wall provide a pressure drop across the thermal reaction unit of about 0.1 to about 5 psi.

In certain embodiments, an apparatus is provided for use during the abatement of a semiconductor manufacturing process. The apparatus includes a thermal reaction unit having (a) an exterior wall having a plurality of perforations adapted to pass of a fluid therethrough; (b) an interior porous wall that defines a central chamber, the interior porous wall formed from a plurality of stacked porous sections; (c) at least one waste gas inlet in fluid communication with the central chamber and adapted to introduce a gaseous waste stream to the central chamber; (d) a thermal mechanism positioned within the central chamber and adapted to decompose the gaseous waste stream within the central chamber, thereby forming reaction products; and (e) a fluid delivery system adapted to provide a fluid through the perforations of the exterior wall and to the central chamber through the interior porous wall at a sufficient force to reduce deposition of reaction products on an inner surface of the interior porous wall of the central chamber. The fluid deliver system is adapted to provide at least one of water, steam, air, clean dry air, clean enriched air, oxygen enriched air, oxygen depleted air, inert gas, a reagent, an oxidizer and depleted air. The fluid delivery system also is adapted to provide a fluid at a pressure of about 600 psig or less.

In certain embodiments, a method is provided for use during the abatement of a semiconductor manufacturing process. The method includes providing a thermal reaction unit having (a) an exterior wall having a plurality of perforations adapted to pass of a fluid therethrough; (b) an interior porous wall that defines a central chamber, the interior porous wall formed from a plurality of stacked porous sections; (c) at least one waste gas inlet in fluid communication with the central chamber and adapted to introduce a gaseous waste stream to the central chamber; (d) a thermal mechanism positioned within the central chamber and adapted to decompose the gaseous waste stream within the central chamber, thereby forming reaction products; and (e) a fluid delivery system adapted to provide a fluid through the perforations of the exterior wall and to the central chamber through the interior porous wall at a sufficient force to reduce deposition of reaction products on an inner surface of the interior porous wall of the central chamber. The perforations in the exterior wall provide a pressure drop across the thermal reaction unit of about 0.1 to about 5 psi. The method also includes employing the thermal reaction unit to abate the semiconductor device manufacturing process.

In certain embodiments, a method is provided for use during the abatement of a semiconductor manufacturing process. The method includes providing a thermal reaction unit having (a) an exterior wall having a plurality of perforations adapted to pass of a fluid therethrough; (b) an interior porous wall that defines a central chamber, the interior porous wall formed from a plurality of stacked porous sections; (c) at least one waste gas inlet in fluid communication with the central chamber and adapted to introduce a gaseous waste stream to the central chamber; (d) a thermal mechanism positioned within the central chamber and adapted to decompose the gaseous waste stream within the central chamber, thereby forming reaction products; and (e) a fluid delivery system adapted to provide a fluid through the perforations of the exterior wall and to the central chamber through the interior porous wall at a sufficient force to reduce deposition of reaction products on an inner surface of the interior porous wall of the central chamber. The fluid deliver system is adapted to provide at least one of water, steam, air, clean dry air, clean enriched air, oxygen enriched air, oxygen depleted air, inert gas, a reagent, an oxidizer and depleted air. The fluid delivery system also is adapted to provide a fluid at a pressure of about 600 psig or less. The method also includes employing the thermal reaction unit to abate the semiconductor device manufacturing process.

In certain embodiments, a system is provided for manufacturing electronic devices. The system includes (a) a plurality of processing tools; (b) an abatement system for abating pollutants from the processing tools and having a plurality of inlet ports; and (e) a manifold for coupling pollutant outlet ports of the plurality of processing tools to the plurality of inlet ports of the abatement system.

In certain embodiments, a system is provided for manufacturing electronic devices. The system includes (a) a processing tool; (b) an abatement system for abating pollutants from the processing tool and including a plurality of chambers, each chamber including a plurality of inlet ports; and (c) a manifold for coupling a pollutant outlet port of the processing tool to the plurality of inlet ports of the abatement system.

In certain embodiments, a system is provided for manufacturing electronic devices. The system includes (a) a plurality of processing tools; and (b) an abatement system for abating pollutants from the processing tools. The abatement system includes a plurality of chambers, each including a plurality of inlet ports. The system also includes a manifold for selectively coupling pollutant outlet ports of the plurality of processing tools to the plurality of inlet ports of the chambers of the abatement system.

In certain embodiments, an apparatus is provided for use during the abatement of a semiconductor manufacturing process. The apparatus includes (a) a plurality of chambers, each chamber including a plurality of waste stream inlet ports; and (b) a manifold for selectively coupling pollutant outlet ports of a plurality of processing tools to the plurality of waste stream inlet ports of the chambers.

In certain embodiments, an apparatus is provided for use during the abatement of a semiconductor manufacturing process. The apparatus includes a thermal reaction unit having (a) an interior porous wall that defines a central chamber and formed from a plurality of stacked ceramic sections; (b) at least one waste gas inlet in fluid communication with the central chamber and adapted to introduce a gaseous waste stream to the central chamber; (c) a thermal mechanism positioned within the central chamber and adapted to decompose the gaseous waste stream within the central chamber, thereby forming reaction products; and (d) a fluid delivery system adapted to provide a fluid to the central chamber through the interior porous wall with sufficient pressure to reduce deposition of reaction products on an inner surface of the interior porous wall of the central chamber. At least one of the stacked ceramic sections is adapted to allow sensing of a characteristic of contents of the central chamber In certain embodiments, an apparatus is provided for use during the abatement of a semiconductor manufacturing process. The apparatus includes a thermal reaction unit having (a) an interior porous wall that defines a central chamber, the interior porous wall formed from a plurality of stacked ceramic sections; (b) at least one waste gas inlet in fluid communication with the central chamber, adapted to introduce a gaseous waste stream to the central chamber, and disposed so as to direct the gaseous waste stream away from the interior porous wall of the chamber; (d) a thermal mechanism positioned within the central chamber and adapted to decompose the gaseous waste stream within the central chamber, thereby forming reaction products; and (e) a fluid delivery system adapted to provide a fluid to the central chamber through the interior porous wall with sufficient pressure to reduce deposition of reaction products on an inner surface of the interior porous wall of the central chamber.

Other features and aspects of the present invention will become more fully apparent from the following detailed description, the appended claims and the accompanying drawings.

DETAILED DESCRIPTION

The present invention relates to methods and systems for providing controlled decomposition of effluent gases in a thermal reactor while reducing accumulation of deposition products within the system. The present invention further relates to an improved thermal reactor design to reduce thermal reaction unit cracking during the high temperature decomposition of effluent gases.

Waste gas to be abated may include, for example, species generated by a semiconductor process and/or species that were delivered to and egressed from the semiconductor process without chemical alteration. As used herein, the term "semiconductor process" is intended to be broadly construed to include any and all processing and unit operations in the manufacture of semiconductor products, flat panel displays and/or LCD products, as well as all operations involving treatment or processing of materials used in or produced by a semiconductor, flat panel display and/or LCD manufacturing facility, as well as all operations carried out in connection with the semiconductor, flat panel display and/or LCD manufacturing facility not involving active manufacturing (examples include conditioning of process equipment, purging of chemical delivery lines in preparation of operation, etch cleaning of process tool chambers, abatement of toxic or hazardous gases from effluents produced by the semiconductor, flat panel display and/or LCD manufacturing facility, etc.).

Figure 1:
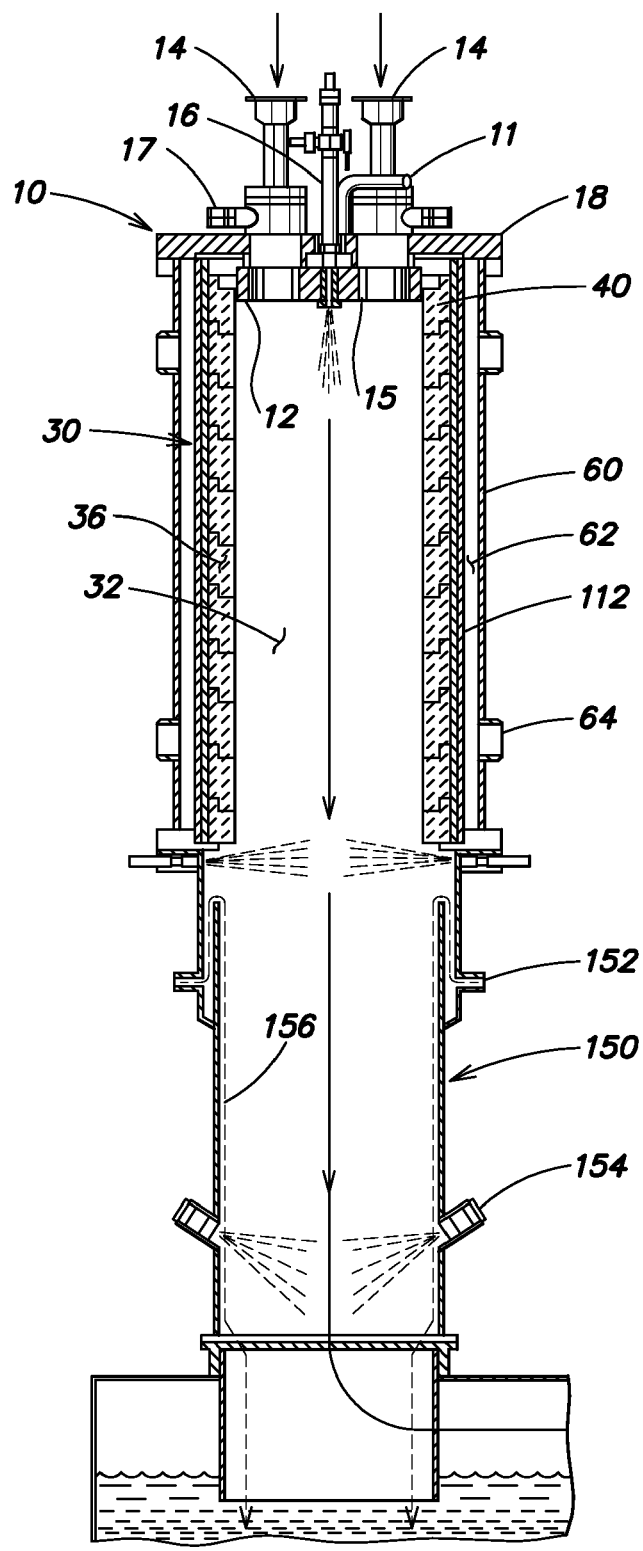
FIG. 1 is a cut away view of a thermal reaction unit, inlet adaptor and lower quenching chamber that may be employed with the present invention.

U.S. patent application Ser. No. 10/987,921, filed Nov. 12, 2004, which is hereby incorporated by reference herein in its entirety and referred to as "the '921 Application") describes an improved thermal reaction system having a thermal reaction unit 30 and a lower quenching chamber 150 as shown in FIG. 1. The thermal reaction unit 30 includes a thermal reaction chamber 32, and an inlet adaptor 10 including a top plate 18, at least one waste gas inlet 14, at least one fuel inlet 17, optionally at least one oxidant inlet 11, burner jets 15, a center jet 16 and an interior plate 12 which is positioned at or within the thermal reaction chamber 32 (see also FIG. 3 for a schematic of the inlet adaptor independent of the thermal reaction unit). The inlet adaptor includes the fuel and oxidant gas inlets to provide a fuel rich gas mixture to the system for the destruction of contaminants. When oxidant is used, the fuel and oxidant may be pre-mixed prior to introduction into the thermal reaction chamber. Fuels contemplated include, but are not limited to, hydrogen, methane, natural gas, propane, LPG and city gas, preferably natural gas. Oxidants contemplated include, but are limited to, oxygen, ozone, air, clean dry air (CDA) and oxygen-enriched air. Waste gases to be abated comprise a species selected from the group consisting of $CF_4$, $C_2F_6$, $SF_6$, $C_3F_8$, $C_4H_8$, $C_4H_8O$, $SiF_4$, $BF_3$, $NF_3$, $BH_3$, $B_2H_6$, $B_5H_9$, $NH_3$, $PH_3$, $SiH_4$, $SeH_2$, $F_2$, $Cl_2$, HCl, HF, HBr, $WF_6$, $H_2$, $Al(CH_3)_3$, primary and secondary amines, oiganosilanes, organometallics, and halosilanes.

Figure 2:
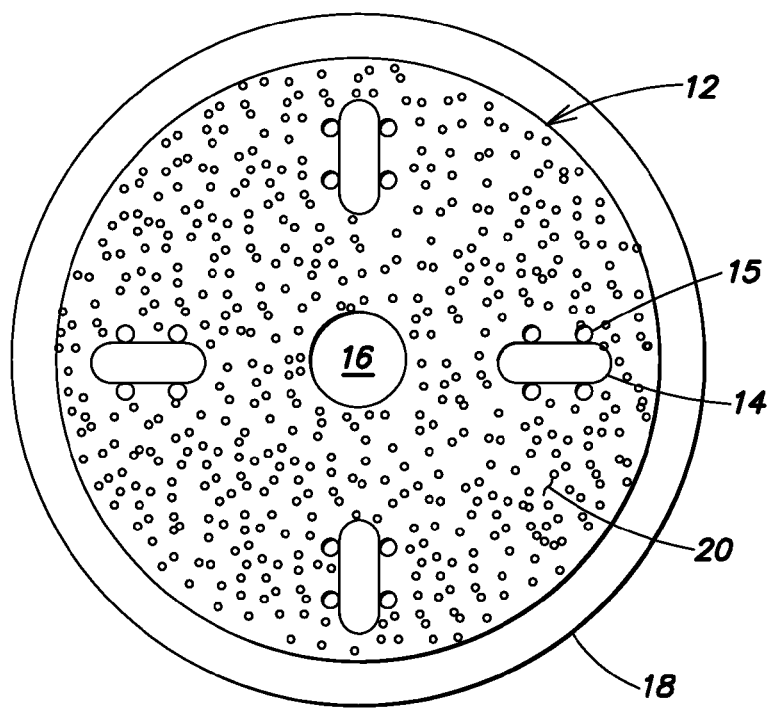
FIG. 2 is an elevational view of the interior plate of the inlet adaptor of FIG. 1.

Prior art inlet adaptors have included limited porosity ceramic plates as the interior plate of the inlet adaptor. A disadvantage of these limited porosity interior plates includes the accumulation of particles on said surface, eventually leading to inlet port clogging and flame detection error. The invention of the '921 Application overcomes these disadvantages by using, in some embodiments, a reticulated ceramic foam as the interior plate 12. FIG. 2 represents an elevational view of the interior plate 12, including the inlet ports 14, burner jets 15, a center jet port 16 and the reticulated ceramic foam 20 of the interior plate. The reticulated ceramic foam 20 has a plurality of pores disposed therethrough. As such, the passage of fluids through the pores of the interior plate to the thermal reaction chamber 32 may reduce the deposition of particulate matter at the surface of the interior plate 12 and the walls of the thermal reaction unit 30 proximate to the interior plate 12. The fluid may include any gas that is preferably pressurized to a suitable pressure, which upon diffusion through the material is sufficient to reduce deposition on the interior plate while not detrimentally affecting the abatement treatment in the thermal reaction chamber. Gases contemplated for passage through the pores of the interior plate 12 include air, CDA, oxygen-enriched air, oxygen, ozone and inert gases, e.g., Ar, $N_2$, etc., and should be devoid of fuels. Further, the fluid may be introduced in a continuous or a pulsating mode.

The reticulated ceramic foam interior plate appears to help prevent particle buildup on the interior plate in part because the exposed planar surface area is reduced thereby reducing the amount of surface available for build-up, because the reticulation of the interior plate provides smaller attachment points for growing particulate matter which will depart the interior plate upon attainment of a critical mass and because the air passing through the pores of the interior plate forms a "boundary layer," keeping particles from migrating to the surface for deposition thereon.

Ceramic foam bodies have an open cell structure characterized by a plurality of interconnected voids surrounded by a web of ceramic structure. They exhibit excellent physical properties such as high strength, low thermal mass, high thermal shock resistance, and high resistance to corrosion at elevated temperatures. The voids may be uniformly distributed throughout the material and the voids are of a size that permits fluids to easily diffuse through the material. The ceramic foam bodies should not react appreciably with PEC's in the effluent to form highly volatile halogen species. The ceramic foam bodies may include alumina materials, magnesium oxide, refractory metal oxides such as $ZrO_2$, silicon carbide and silicon nitride, preferably higher purity alumina materials, e.g., spinel, and yttria-doped alumina materials. Most preferably, the ceramic foam bodies are ceramic bodies formed from yttria-doped alumina materials and yttria-stabilized zirconia-alumina (YZA). The preparation of ceramic foam bodies is well within the knowledge of those skilled in the art.

Figure 3:
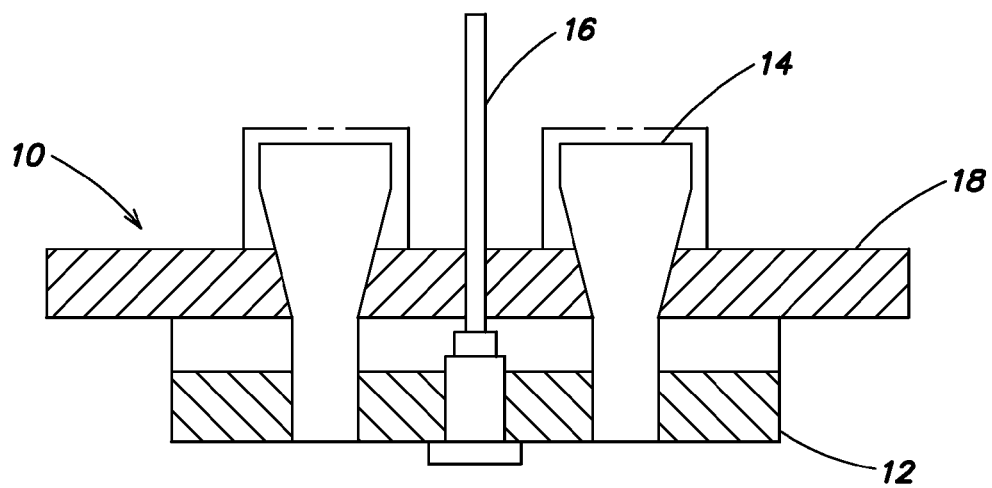
FIG. 3 is a partial cut-away view of the inlet adaptor of FIG. 1.
Figure 4:
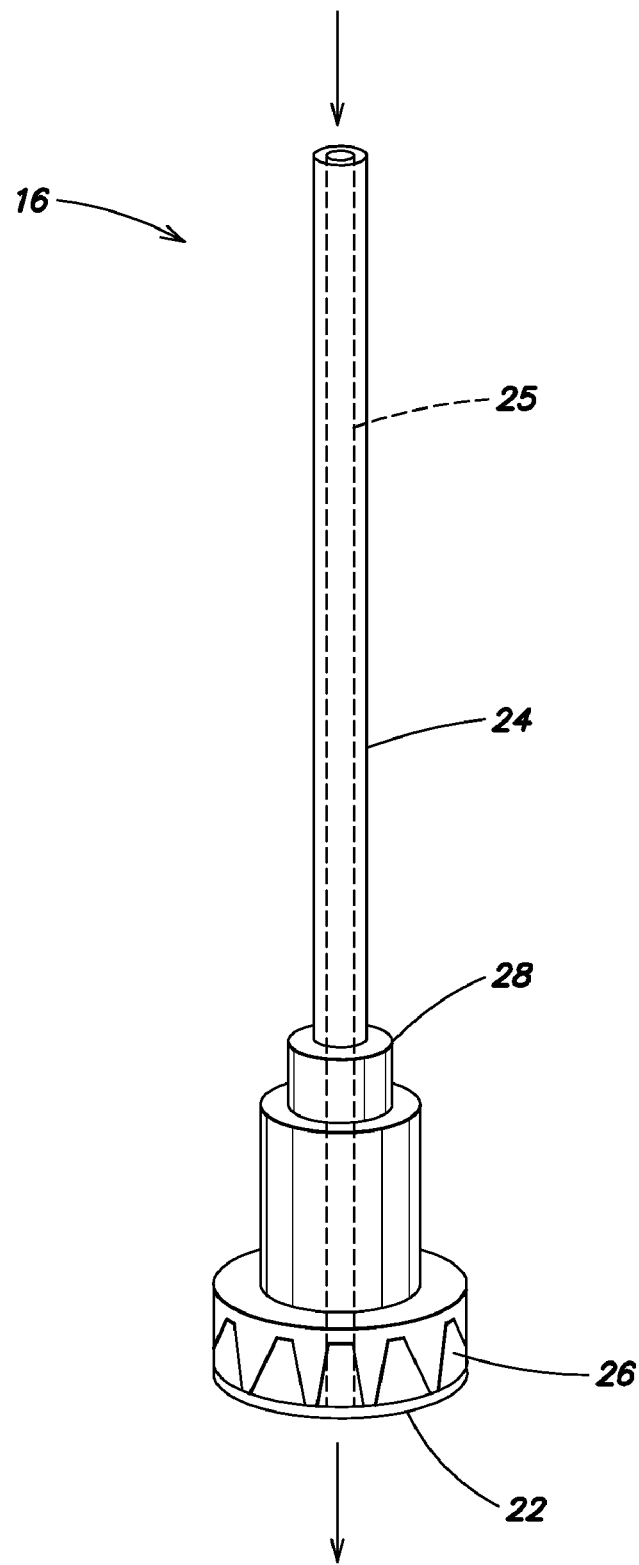
FIG. 4 is a view of a center jet of FIG. 1.
Figure 5:
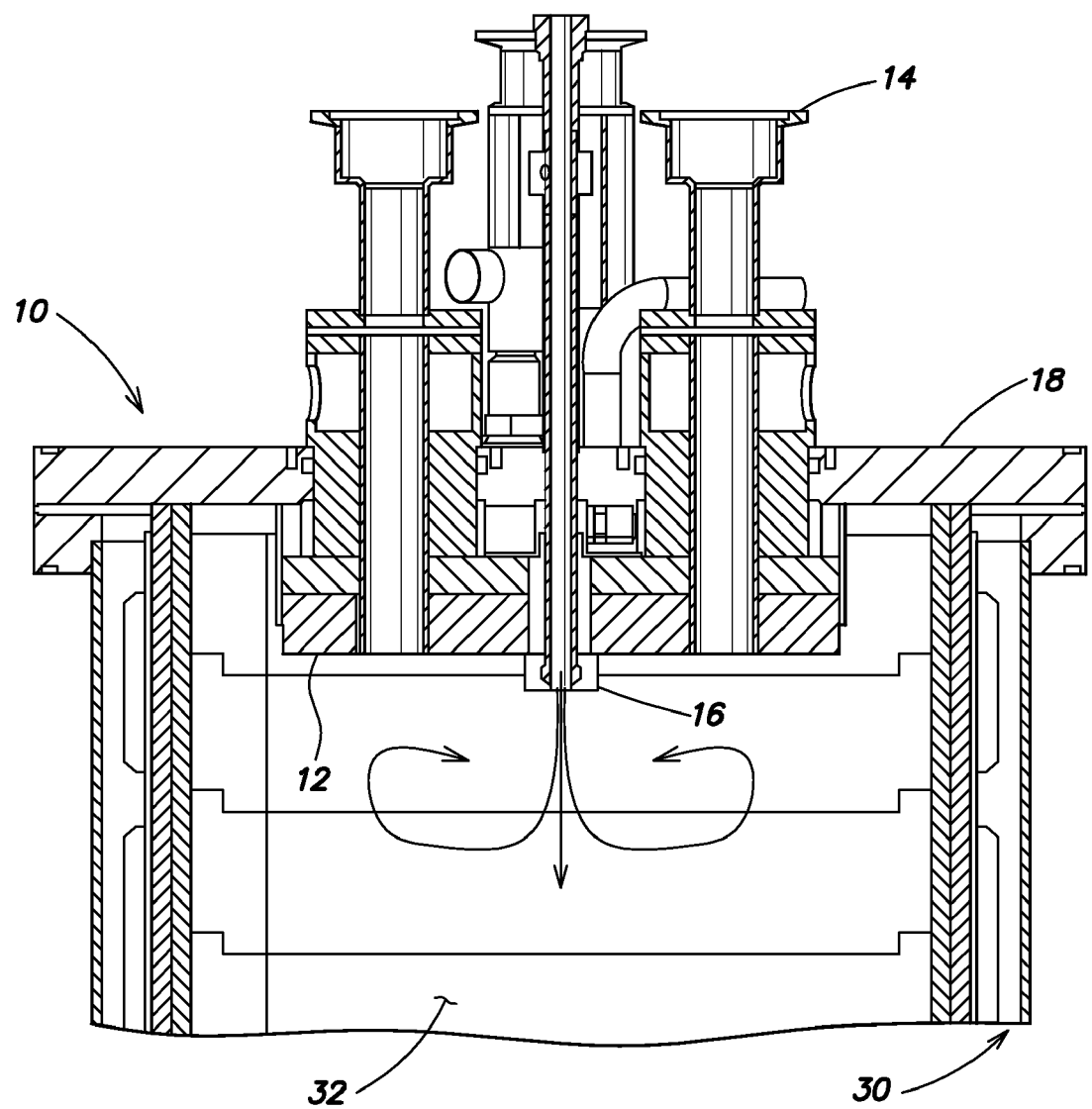
FIG. 5 is a cut away view of the inlet adaptor and the thermal reaction unit of FIG. 1.

To further reduce particle build-up on the interior plate 12, a fluid inlet passageway may be incorporated into the center jet 16 of the inlet adaptor 10 (see for example FIGS. 1, 3 and 5 for placement of the center jet in the inlet adaptor). An embodiment of the center jet 16 is illustrated in FIG. 4, said center jet including a pilot injection manifold tube 24, pilot ports 26, a pilot flame protective plate 22 and a fastening means 28, e.g., threading complementary to threading on the inlet adaptor, whereby the center jet and the inlet adaptor may be complementarily mated with one another in a leak-tight fashion. The pilot flame of the center jet 16 is used to ignite the burner jets 15 of the inlet adaptor. Through the center of the center jet 16 is a bore-hole 25 through which a stream of high velocity fluid may be introduced to inject into the thermal reaction chamber 32 (see, e.g., FIG. 5). It is thought that the high velocity air alters the aerodynamics and pulls gaseous and/or particulate components of the thermal reaction chamber towards the center of the chamber thereby keeping the particulate matter from getting close to the top plate and the chamber walls proximate to the top plate. The high velocity fluid may include any gas sufficient to reduce deposition on the interior walls of the thermal reaction unit while not detrimentally affecting the abatement treatment in the thermal reaction chamber. Further, the fluid may be introduced in a continuous or a pulsating mode, preferably a continuous mode. Gases contemplated include air, CDA, oxygen-enriched air, oxygen, ozone and inert gases, e.g., Ar, $N_2$, etc. Preferably, the gas is CDA and may be oxygen-enriched. In another embodiment, the high velocity fluid is heated prior to introduction into the thermal reaction chamber.

Figure 6A:
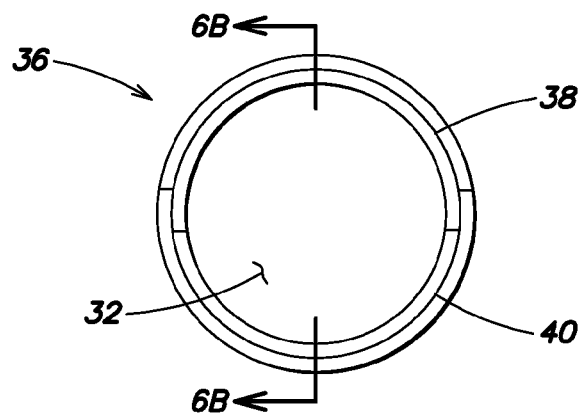
FIG. 6A is an elevational view of a ceramic ring of the thermal reaction unit of FIG. 1.
Figure 6B:
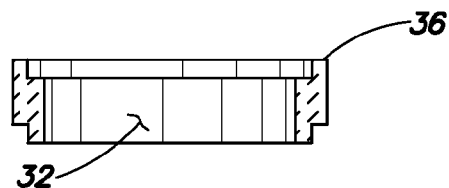
FIG. 6B is a partial cut-away view of the ceramic ring of FIG. 6A.
Figure 6C:
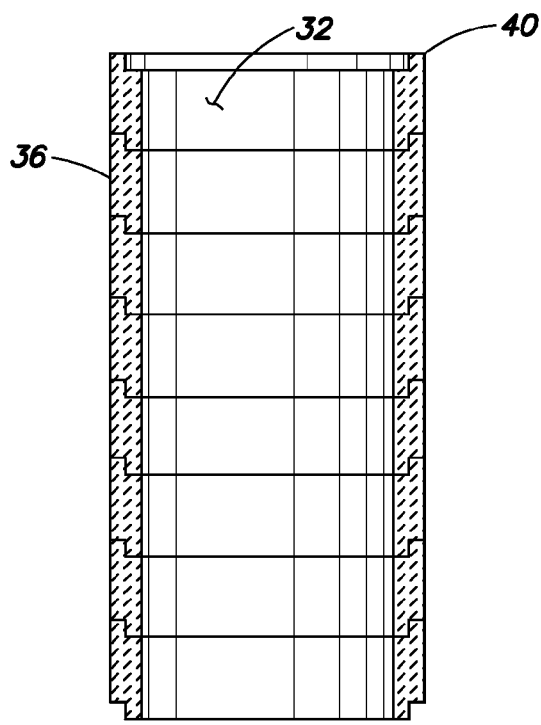
FIG. 6C is a partial cut-away view of ceramic rings stacked upon one another to define the thermal reaction chamber of FIG. 1.

In yet another embodiment, the thermal reaction unit includes a porous ceramic cylinder design defining the thermal reaction chamber 32. High velocity air may be directed through the pores of the thermal reaction unit 30 to at least partially reduce particle buildup on the interior walls of the thermal reaction unit. The ceramic cylinder includes at least two ceramic rings stacked upon one another, for example as illustrated in FIG. 6C. More preferably, the ceramic cylinder includes at least about two to about twenty rings stacked upon one another. The term "ring" is not limited to circular rings per se, but may also include rings of any polygonal or elliptical shape. Preferably, the rings are generally tubular in form.

FIG. 6C is a partial cut-away view of the ceramic cylinder design showing the stacking of the individual ceramic rings 36 having a complimentary ship-lap joint design, wherein the stacked ceramic rings define the thermal reaction chamber 32.

The uppermost ceramic ring 40 is designed to accommodate the inlet adaptor. It is noted that the joint design is not limited to lap joints but may also include beveled joints, butt joints, lap joints and tongue and groove joints. Gasketing or sealing means, e.g., GRAFOIL® or other high temperature materials, positioned between the stacked rings is contemplated, especially if the stacked ceramic rings are butt jointed. Preferably, the joints between the stacked ceramic rings overlap, e.g., ship-lap, to prevent infrared radiation from escaping from the thermal reaction chamber.

Each ceramic ring may be a circumferentially continuous ceramic ring or alternatively, may be at least two sections that may be joined together to make up the ceramic ring. FIG. 6A illustrates the latter embodiment, wherein the ceramic ring 36 includes a first arcuate section 38 and a second arcuate section 40, and when the first and second arcuate sections are coupled together, a ring is formed that defines a portion of the thermal reaction chamber 32. The ceramic rings are preferably formed of the same materials as the ceramic foam bodies discussed previously, e.g., YZA.

The advantage of having a thermal reaction chamber defined by individual stacked ceramic rings includes the reduction of cracking of the ceramic rings of the chamber due to thermal shock and concomitantly a reduction of equipment costs. For example, if one ceramic ring cracks, the damaged ring may be readily replaced for a fraction of the cost and the thermal reactor placed back online immediately.

Figure 7:
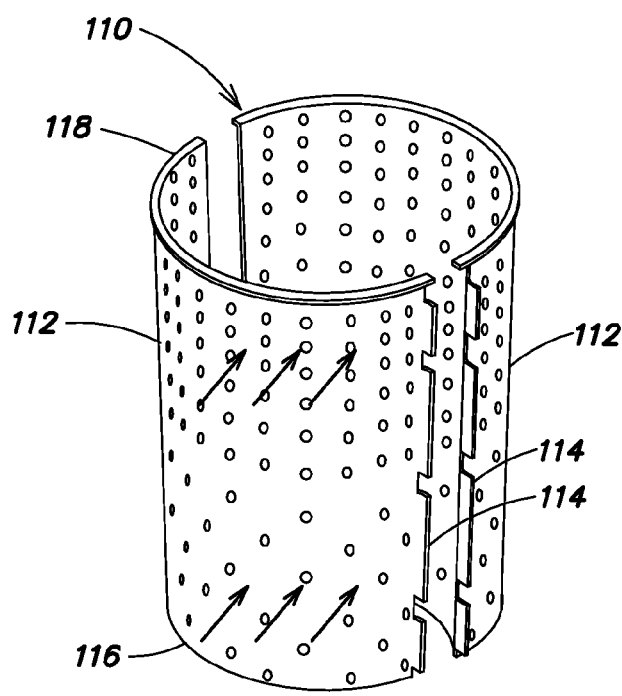
FIG. 7 is a view of the sections of a perforated metal shell that may be used in the chamber of FIG. 1.

The ceramic rings are held to another to form the thermal reaction unit 30 whereby high velocity air may be directed through the pores of the ceramic rings of the thermal reaction unit to at least partially reduce particle buildup at the interior walls of the thermal reaction unit. Towards that end, a perforated metal shell may be used to encase the stacked ceramic rings of the thermal reaction unit as well as control the flow of axially directed air through the porous interior walls of the thermal reaction unit. FIG. 7 illustrates an embodiment of the perforated metal shell 110, wherein the metal shell has the same general form of the stacked ceramic rings, e.g., a circular cylinder or a polygonal cylinder, and the metal shell includes at least two attachable sections 112 that may be joined together to make up the general form of the ceramic cylinder. The two attachable sections 112 include ribs 114, e.g., clampable extensions 114, which upon coupling put pressure on the ceramic rings thereby holding the rings to one another.

Figure 8:
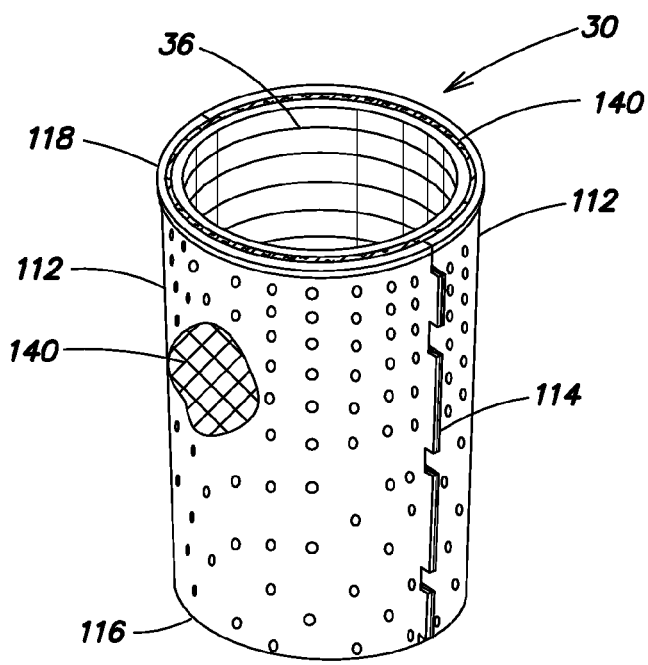
FIG. 8 is an exterior view of an embodiment of the thermal reaction unit of FIG. 1.

The metal shell 110 has a perforated pattern whereby preferably more air is directed towards the top of the thermal reaction unit, e.g., the portion closer to the inlet adaptor 10, than the bottom of the thermal reaction unit, e.g., the lower chamber (see FIGS. 7 and 8). In the alternative, the perforated pattern is the same throughout the metal shell. As defined herein, "perforations" may represent any array of openings through the metal shell that do not compromise the integrity and strength of the metal shell, while ensuring that the flow of axially directed air through the porous interior walls may be controlled. For example, the perforations may be holes having circular, polygonal or elliptical shapes or in the alternative, the perforations may be slits of various lengths and widths. In one embodiment, the perforations are holes 1/16" in diameter, and the perforation pattern towards the top of the thermal reaction unit has 1 hole per square inch, while the perforation pattern towards the bottom of the thermal reaction unit has 0.5 holes per square inch (in other words 2 holes per 4 square inches). Preferably, the perforation area is about 0.1% to 1% of the area of the metal shell. The metal shell is constructed from corrosion-resistant metals including, but not limited to: stainless steel; austenitic nickel-chromiumiron alloys such as Inconel® 600, 601, 617, 625, 625 LCF, 706, 718, 718 SPF, X-750, MA754, 783, 792, and HX; and other nickel-based alloys such as Hastelloy B, B2, C, C22, C276, C2000, G, G2, G3 and G30.

Referring to FIG. 8, the ceramic rings 36 are stacked upon one another, at least one layer of a fibrous blanket is wrapped around the exterior of the stacked ceramic rings and then the sections 112 of the metal shell 110 are positioned around the fibrous blanket and tightly attached together by coupling the ribs 114. The fibrous blanket can be any fibrous inorganic material having a low thermal conductivity, high temperature capability and an ability to deal with the thermal expansion coefficient mismatch of the metal shell and the ceramic rings. Fibrous blanket material contemplated includes, but is not limited to, spinel fibers, glass wool and other materials comprising aluminum silicates. In the alternative, the fibrous blanket may be a soft ceramic sleeve.

In practice, fluid flow is axially and controllably introduced through the perforations of the metal shell, the fibrous blanket and the reticulated ceramic rings of the cylinder. The fluid experiences a pressure drop from the exterior of the thermal reaction unit to the interior of the thermal reaction unit in a range from about 0.05 psi to about 0.30 psi, preferably about 0.1 psi to 0.2 psi. The fluid may be introduced in a continuous or a pulsating mode, preferably a continuous mode to reduce the recirculation of the fluid within the thermal reaction chamber. An increased residence time within the thermal reaction chamber, wherein the gases are recirculated, results in the formation of larger particulate material and an increased probability of deposition within the reactor. The fluid may include any gas sufficient to reduce deposition on the interior walls of the ceramic rings while not detrimentally affecting the abatement treatment in the thermal reaction chamber. Gases contemplated include air, CDA, oxygen-enriched air, oxygen, ozone and inert gases, e.g., Ar, $N_2$, etc.

To introduce fluid to the walls of the thermal reaction unit for passage through to the thermal reaction chamber 32, the entire thermal reaction unit 30 is encased within an outer stainless steel reactor shell 60 (see, e.g., FIG. 1), whereby an annular space 62 is created between the interior wall of the outer reactor shell 60 and the exterior wall of the thermal reaction unit 30. Fluids to be introduced through the walls of the thermal reaction unit may be introduced at ports 64 positioned on the outer reactor shell 60.

Figure 9:
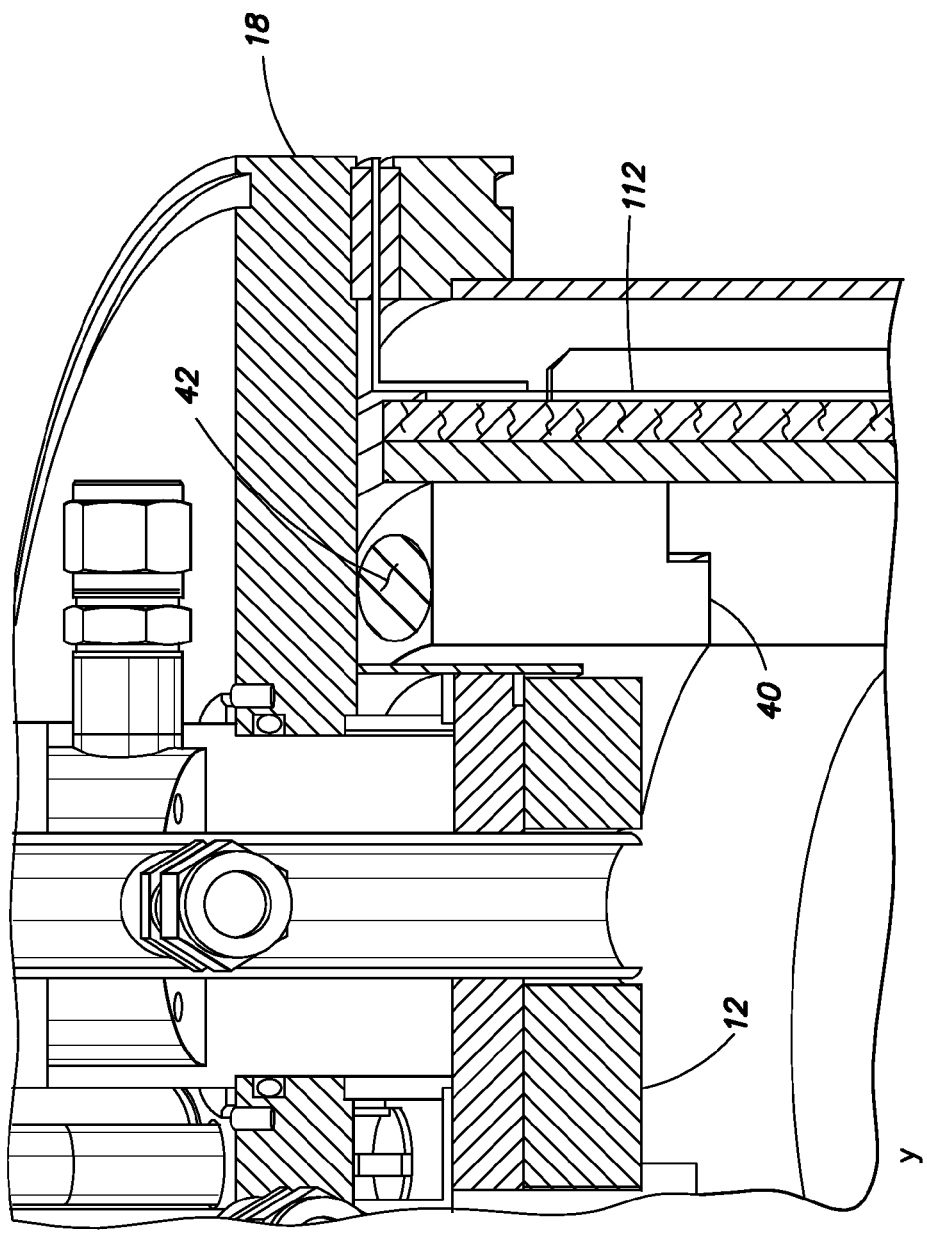
FIG. 9 is a partial cut-away view of an exemplary inlet adaptor/thermal reaction unit joint for the reaction unit of FIG. 1.

Referring to FIG. 1, the interior plate 12 of the inlet adaptor 10 is positioned at or within the thermal reaction chamber 32 of the thermal reaction unit 30. To ensure that gases within the thermal reaction unit do not leak from the region where the inlet adaptor contacts the thermal reaction unit, a gasket or seal 42 is preferably positioned between the top ceramic ring 40 and the top plate 18 (see, e.g., FIG. 9). The gasket or seal 42 may be GRAFOIL® or some other high temperature material that will prevent leakage of blow-off air through the top plate/thermal reaction unit joint, i.e., to maintain a backpressure behind the ceramic rings for gas distribution.

Downstream of the thermal reaction chamber is a water quenching means positioned in the lower quenching chamber 150 to capture the particulate matter that egresses from the thermal reaction chamber. The water quenching means may include a water curtain as disclosed in co-pending U.S. patent application No. 10/249,703 in the name of Glenn Tom et al., entitled "Gas Processing System Comprising a Water Curtain for Preventing Solids Deposition on Interior Walls Thereof," which is hereby incorporated by reference in the entirety. Referring to FIG. 1, the water for the water curtain is introduced at inlet 152 and water curtain 156 is formed, whereby the water curtain absorbs the heat of the combustion and decomposition reactions occurring in the thermal reaction unit 30, eliminates build-up of particulate matter on the walls of the lower quenching chamber 150, and absorbs water soluble gaseous products of the decomposition and combustion reactions, e.g., $CO_2$, HF, etc.

To ensure that the bottom-most ceramic ring does not get wet, a shield 202 (see, e.g., FIG. 12) may be positioned between the bottom-most ceramic ring 198 and the water curtain in the lower chamber 150. Preferably, the shield is L-shaped and assumes the three-dimensional form of the bottom-most ceramic ring, e.g., a circular ring, so that water does not come in contact with the bottom-most ceramic ring. The shield may be constructed from any material that is water- and corrosion-resistant and thermally stable including, but not limited to: stainless steel; austenitic nickel-chromium-iron alloys such as Inconel® 600, 601, 617, 625, 625 LCF, 706, 718, 718 SPF, X-750, MA754, 783, 792, and HX; and other nickel-based alloys such as Hastelloy B, B2, C, C22, C276, C2000, G, G2, G3 and G30.

In practice, effluent gases enter the thermal reaction chamber 32 from at least one inlet provided in the inlet adaptor 10, and the fuel/oxidant mixture enter the thermal reaction chamber 32 from at least one burner jet 15. The pilot flame of the center jet 16 is used to ignite the burner jets 15 of the inlet adaptor, creating thermal reaction unit temperatures in a range from about 500° C. to about 2000° C. The high temperatures facilitate decomposition of the effluent gases that are present within the thermal reaction chamber. It is also possible that some effluent gases undergo combustion/oxidation in the presence of the fuel/oxidant mixture. The pressure within the thermal reaction chamber is in a range from about 0.5 atm to about 5 atm, preferably slightly subatmospheric, e.g., about 0.98 atm to about 0.99 atm.

Following decomposition/combustion, the effluent gases pass to the lower chamber 150 wherein a water curtain 156 may be used to cool the walls of the lower chamber and inhibit deposition of particulate matter on the walls. It is contemplated that some particulate matter and water soluble gases may be removed from the gas stream using the water curtain 156. Further downstream of the water curtain, a water spraying means 154 may be positioned within the lower quenching chamber 150 to cool the gas stream, and remove the particulate matter and water soluble gases. Cooling the gas stream allows for the use of lower temperature materials downstream of the water spraying means thereby reducing material costs. Gases passing through the lower quenching chamber may be released to the atmosphere or alternatively may be directed to additional treatment units including, but not limited to, liquid/liquid scrubbing, physical and/or chemical adsorption, coal traps, electrostatic precipitators, and cyclones. Following passage through the thermal reaction unit and the lower quenching chamber, the concentration of the effluent gases is preferably below detection limits, e.g., less than 1 ppm.

Figure 10:
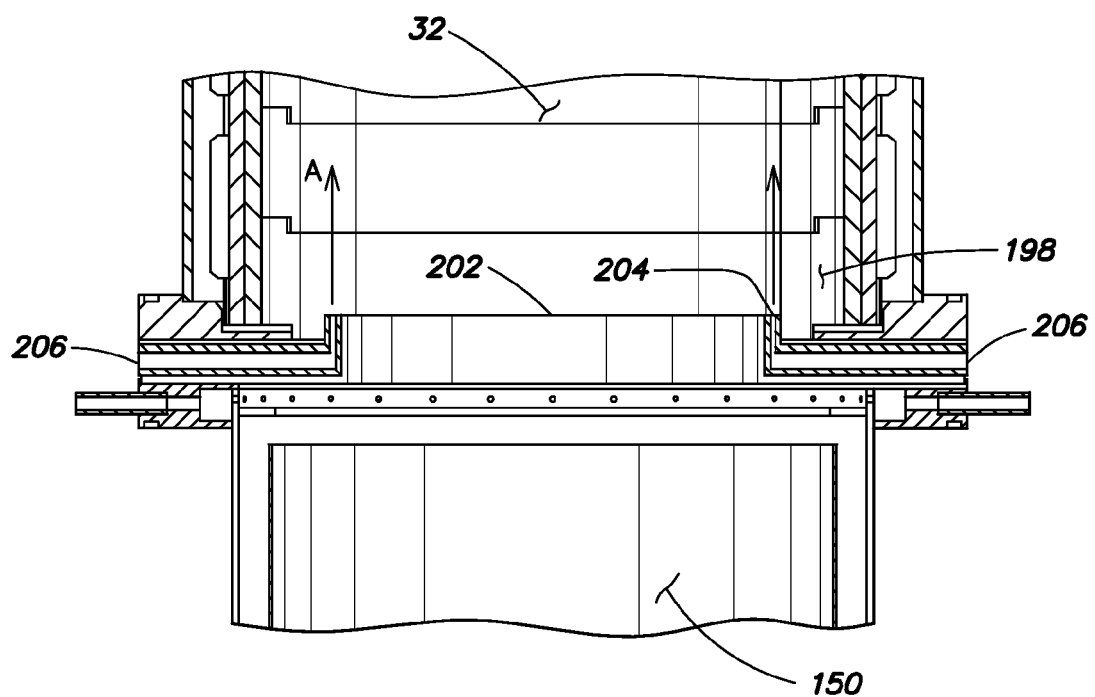
FIG. 10 is a partial cut-away view of an exemplary shield that may be positioned between the thermal reaction unit and the lower quenching chamber of FIG. 1.

In an alternative embodiment, an "air knife" is positioned within the thermal reaction unit. Referring to FIG. 10, fluid may be intermittently injected into the air knife inlet 206, which is situated between the bottom-most ceramic ring 198 and the water quenching means in the lower quenching chamber 150. The air knife inlet 206 may be incorporated into the shield 202 which prevents water from wetting the bottom-most ceramic ring 198 as described. The air knife fluid may include any gas sufficient to reduce deposition on the interior walls of the thermal reaction unit while not detrimentally affecting the decomposition treatment in said unit. Gases contemplated include air, CDA, oxygen-enriched air, oxygen, ozone and inert gases, e.g., Ar, $N_2$, etc. In operation, gas is intermittently injected through the air knife inlet 206 and exits a very thin slit 204 that is positioned parallel to the interior wall of the thermal reaction chamber 32. Thus, gases are directed upwards along the wall (in the direction of the arrows in FIG. 10) to force any deposited particulate matter from the surface of the interior wall.

Improved Reactor Design

In accordance with the present invention, improvements are provided to the thermal reaction unit 30 of FIG. 1. For example, FIG. 11A is a partial cut-away view of the thermal reaction chamber 32 in which the thermal reaction chamber 32 is formed from a plurality of stacked, porous ceramic sections 36*a-h*. While eight stacked, porous ceramic sections are shown in FIG. 11A, it will be understood that fewer or more than eight stacked sections may be used. For example, in one particular embodiment, eleven porous ceramic sections may be used. In some embodiments, more or less than eleven porous ceramic sections may be used. The ceramic sections 36*a-h* may be round, elliptical, triangular, square, rectangular, polygonal, pentagonal, hexagonal, octagonal, or otherwise shaped. The ceramic sections may include stackable washers, chevrons, rings or any other suitable shape and/or configuration. Rings may be any suitable shape (as described above such as round, elliptical polygonal, etc.).

In one or more embodiments, at least one of the porous sections may include a non-rigid material. For example, a porous section may include yttria doped aluminum fiber. As another example, in some embodiments, at least one of the porous sections may include a ceramic, a sintered ceramic, a sintered metal, a porous metal material, doped aluminum fiber, glass and/or a porous polymeric material.

In a particular embodiment, at least one of the porous sections may include $MgAl_2O_4$, $Al_2O_3$, SiC, and/or MgO. A doped ceramic also may be used such as a ceramic doped with yttria, La, Ce, Pr, Nd, Pm, Sm, Eu, Gd, Tb, Dy, Ho, Er, Tm, Yb, Lu and/or any other suitable dopant.

Figure 11B:
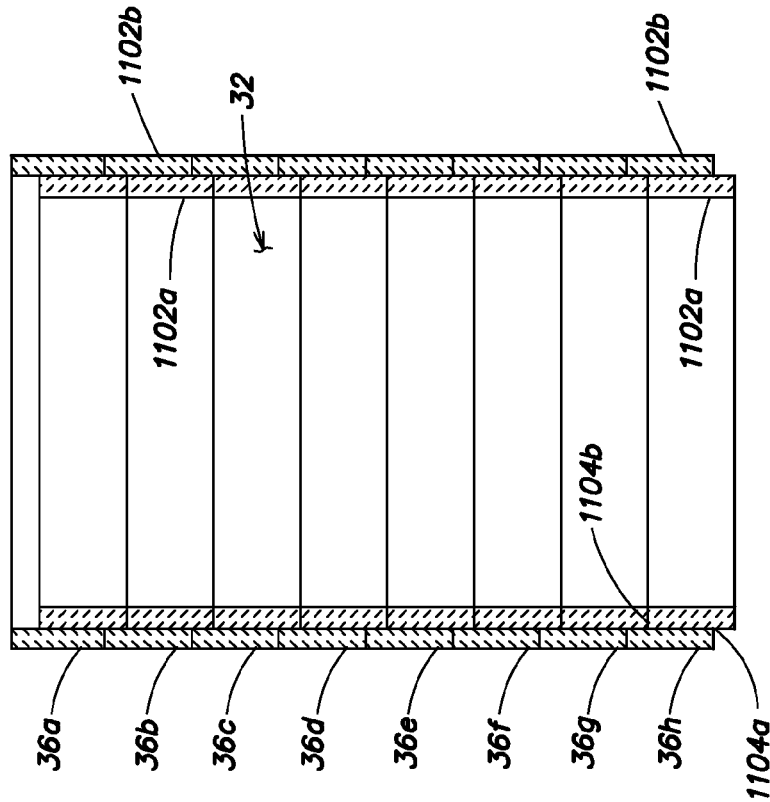
FIG. 11B illustrates an embodiment of the thermal reaction chamber of FIG. 11A in which each ceramic section is formed from two ceramic subsections.
Figure 11A:
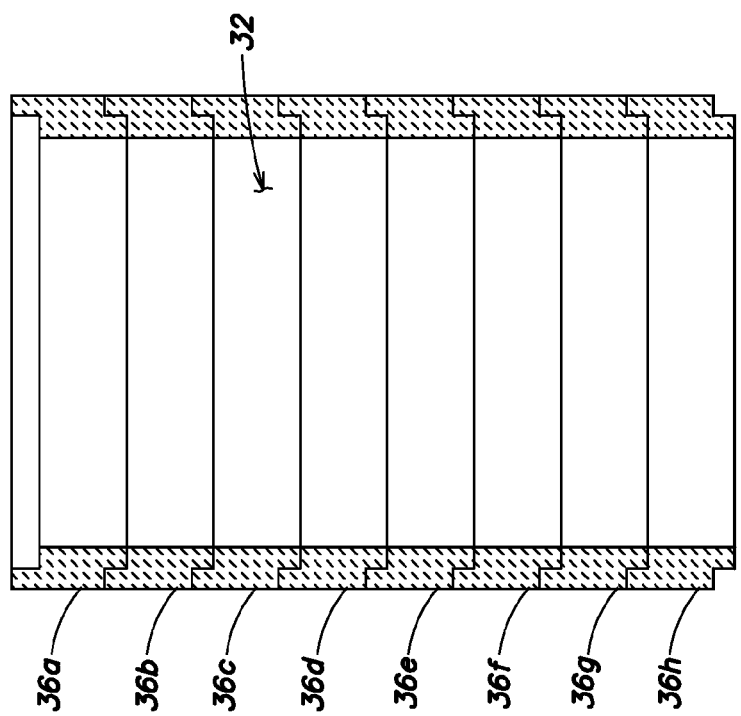
FIG. 11A is a partial cut-away view of the thermal reaction unit in which the thermal reaction chamber is formed from a plurality of stacked, porous ceramic sections.

FIG. 11B illustrates an embodiment of the thermal reaction chamber 32 of FIG. 11A in which each ceramic section 36*a-h* is formed from two ceramic subsections 1102*a*, 1102*b*. The first ceramic subsection 1102*a* is sized so as to fit within and to bond to the second ceramic subsection 1102*b* so as to form lap joints 1104*a-b*. The lap joints 1104*a-b* may be used to couple ceramic sections 36*a-h* together as shown. Gluing or any other bonding technique may be used to couple ceramic subsections 1102*a*, 1102*b* together. Use of such bonded ceramic sections may reduce manufacturing costs.

In at least one embodiment, the thermal reaction chamber 32 may have a graded and/or varying coefficient of thermal expansion (CTE). For example, the ceramic sections closest to the inlets of the reaction chamber 32 (the top of the reaction unit in FIG. 11A) may have a smaller CTE than the ceramic sections further from the inlets. In one particular embodiment, the first ceramic section 36*a* (closest to the inlets) may have the smallest CTE and the eighth ceramic section 36*h* (furthest from the inlets) may have the largest CTE. The remaining ceramic sections 36*b-g* may have CTE's that range from, and in some embodiments decrease in value from, the highest CTE and the lowest CTE. The above embodiment may provide a cost savings for the thermal reaction chamber 32 as more expensive, lower CTE ceramics may be used close to the inlets of the reaction chamber 32 (e.g., where temperatures are the highest), and cheaper, higher CTE ceramics may be used in regions of the reaction chamber 32 that are subjected to lower temperatures.

In the same or another embodiment, higher quality ceramics, such as 99.99% $Al2O3$, that are more temperature and/or chemical resistant may be used for the ceramic section or sections closest to the inlets of the thermal reaction chamber 32, while lower quality ceramics, such as 98% $Al2O3$, may be used for the ceramic sections further from the inlets of the thermal reaction chamber 32.

In the same or another embodiment, the CTE of each ceramic section may be graded or otherwise vary. For example, the CTE of a ceramic section may be graded so that portions of the ceramic section that experience the highest temperatures have the lowest CTE. In the embodiment of FIG. 11A, for instance, each ceramic section may have a graded CTE that decreases from the top to the bottom of the ceramic section and/or from the inside to the outside of the ceramic section.

In the same or another embodiment, the porosity, composition, dopant type and/or concentration, etc., of each ceramic section and/or between ceramic sections may be graded and/or vary. Likewise, the pores may vary in size, shape, density, etc., within a ceramic section and/or between ceramic sections. Also, the pores may be uniform in shape, tapered (e.g., with a larger opening on the inside or the outside of a section), or otherwise shaped. Multiple pore sizes may be used within a ceramic section (e.g., pores 2, 3, 4, etc., different diameters).

In one or more embodiments, a first porous section may have a first doping level and a second porous section may have a second, different doping level. For example, higher dopant level porous sections may be used closest to the inlets of a thermal reaction chamber. In some embodiments, at least one of a CTE, a purity level and a doping level of each porous section may be selected based on a temperature profile within a thermal reaction unit during abatement. Further, at least one of a CTE, a purity level and a doping level of each porous section may be selected so that expansion of each porous section is approximately equal within the thermal reaction unit during abatement. In one or more embodiments, each ceramic ring may have a different CTE, purity level and/or dopant level.

In yet other embodiments, one or more of the ceramic sections may include or be adapted to accommodate and/or facilitate the use of one or more sensors (e.g., by having a void or other space for one or more sensors). For example, one or more ceramic sections may include a temperature, NOX, pressure, radiation or other suitable sensor. One or more such sensors may be coupled to a controller and used to provide better control over or monitoring of an abatement process within the thermal reaction chamber 32 (e.g., via a feedback loop that allows adjustment of flow rates, gas concentrations, etc.). One or more ceramic sections alternatively or additionally may include one or more ports that allow gas to be flowed through the ceramic sections (e.g., during a purge operation) and/or that allow gas to be extracted from the thermal reaction chamber 32 (e.g., via a sampling operation). For example, periodic or random sampling of reaction gases and/or products may be performed through a port within a ceramic section (to allow analysis of a combustion process).

Figure 12:
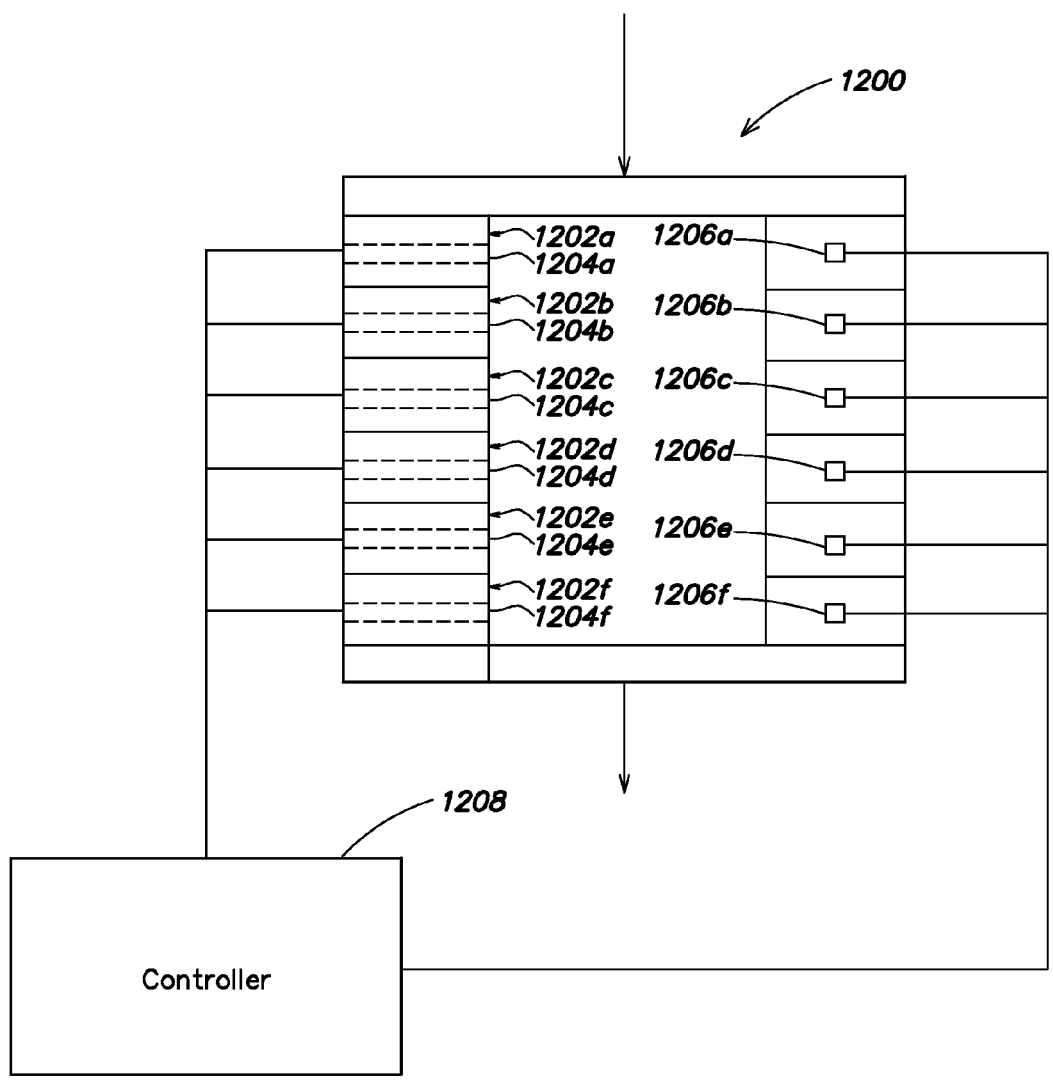
FIG. 12 is a schematic diagram of an exemplary thermal reaction chamber defined by a plurality of ceramic sections.

FIG. 12 is a schematic diagram of an exemplary thermal reaction chamber 1200 defined by a plurality of ceramic sections 1202*a-f*. Fewer or more ceramic sections may be used. Each ceramic section 1202*a-f* includes a port 1204*a-f* for purging and/or sampling the chamber 1200. Additionally, each ceramic section 1202*a-f* includes a sensor 1206*a-f* for sensing a characteristic of the chamber 1200 (e.g., temperature, NOX level, etc.). Each port 1204*a-f* and/or sensor 1206*a-f* may be in communication with and/or controlled via a controller 1208. The controller 1208 may include, for example, one or more microcontrollers, microprocessors, dedicated hardware, a combination of the same, etc. In at least one embodiment, the controller 1208 may use information gathered from the ports 1204*a-f* and/or sensors 1206*a-f* to control process parameters associated with the thermal reaction chamber 1200 (e.g., flow rates, gas concentrations, etc.).

In one or more embodiments, multiple processing tools (e.g., cluster or similar tools) may be abated using a single thermal abatement system, such as the thermal reaction chamber 30 and/or quenching unit 150. For example, 2, 3, 4, 5, 6, etc., processing tools may be so abated. Likewise, multiple thermal abatement systems may service that same tool (e.g., for redundancy). For example, two of the thermal abatement systems described herein may be used to abate three or more processing tools. In this manner, each processing tool includes a redundant abatement system yet fewer than one abatement system per processing tool is required. Other similar configurations may be used (e.g., 3 abatement systems servicing 4, 5, 6, etc., processing tools). Additional inlets may be provided for each abatement system as required to service multiple processing tools (e.g., 2, 3, 4, 5, 6, 7, 8, 9, 10, etc., inlets). Also, multiple abatement systems may service a single tool (e.g., 2, 3, 4, 5, etc., abatement systems per tool). Thus, the system may be configured with multiple processing tools serviced by multiple thermal abatement chambers; multiple processing tools serviced by a single thermal abatement chamber; and/or a single processing tool serviced by multiple thermal abatement chambers. In some embodiments where the capacity of the thermal abatement chambers exceeds the pollutant output load, one or more thermal abatement chambers may serve as secondary or back-up abatement chambers that are not used unless a primary thermal abatement chamber goes offline. In such embodiments, a manifold may be used to selectively direct the waste to the active abatement chambers and away from the inactive chambers. The manifold may be operated under control of a system controller and may respond to feedback from the abatement chambers and/or information about the quantity and composition of the waste flow from the possessing tools and/or sensors in or upstream of the manifold.

Figure 13:
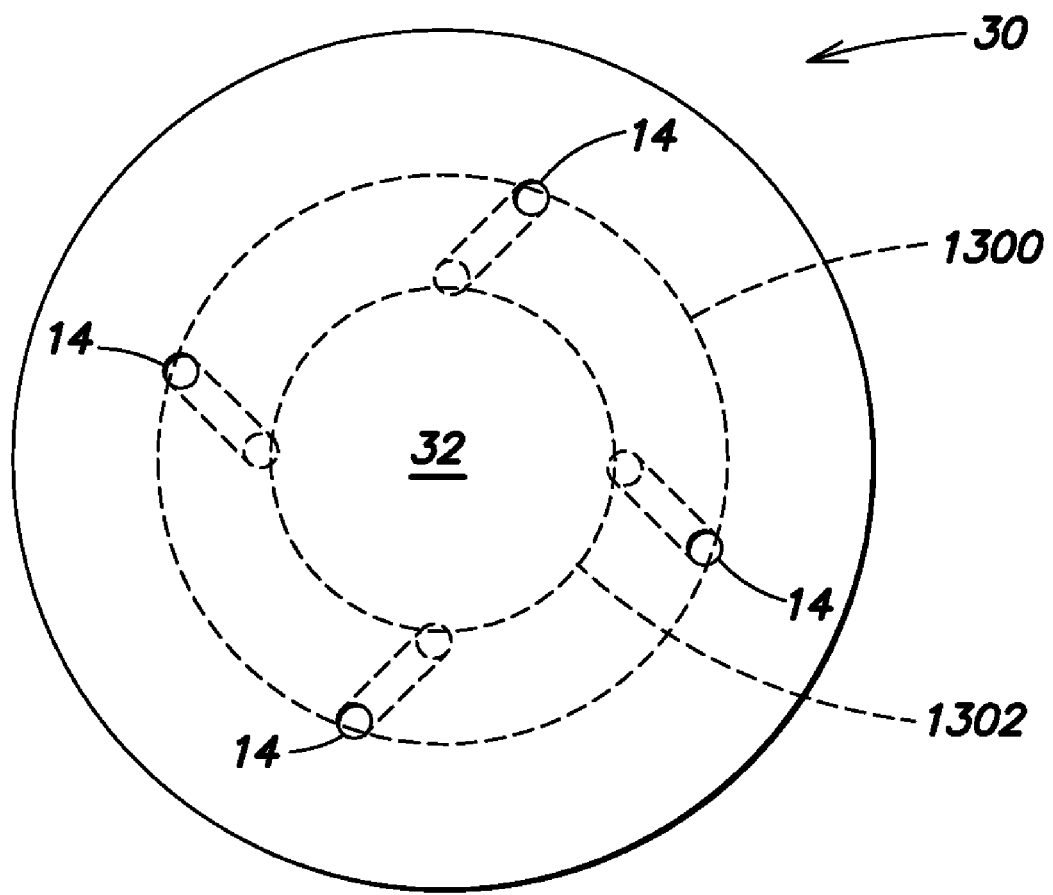
FIG. 13 is a top view of an exemplary embodiment of the thermal reaction unit in which inlet ports to the reaction chamber are angled.

FIG. 13 is a top view of an exemplary embodiment of the thermal reaction unit 30 in which inlet ports 14 to the reaction chamber 32 are angled (e.g., relative to vertical) so as to direct effluent and/or other gasses away from inner wall 1300 of the reaction chamber 32 toward a central reaction zone 1302. The inlet ports 14 also may be angled to create a turbulent and/or swirling combustion zone as shown. Exemplary angles for the inlet ports include 2 to 45 degrees from vertical, although other angles may be used. The inlet ports may be angled to direct the waste in a helical vortex pattern that maximizes the residence time of the waste in the reaction chamber to increase the combustion of all the waste. In some embodiments, the angle of the inlet ports 14 may be adjustable based upon the desired helical vortex pattern for a given type of waste. For example, certain waste may benefit from a longer residence time while other types may not require a longer residence time and may be combusted most efficiently when introduced at a steeper (e.g., more downward) angle. The angle of the inlet ports 14 may be controlled by a system controller based upon feedback from the processing tools, sensors (e.g., temperature, pressure, flow, composition, etc.) in the manifold, and/or sensors in the reaction chamber 32. The angle of the inlet ports 14 may be selected based upon sensor information or known information about the waste itself (e.g., quantity, composition, etc.) and/or the processes that generated the waste.

In some embodiments, the perforations in the metal shell provide a pressure drop across the thermal reaction unit of about 0.1 to about 5 psi. In one embodiment, about 22 stacked ceramic rings may be employed for the chamber 32.

A two-stage reactor for removing pollutants from gaseous streams may include an upper thermal reaction chamber and a lower reaction chamber. The upper thermal reaction chamber may include an outer exterior wall, an interior porous wall that defines a central decomposition and conversion chamber, at least one waste gas inlet in fluid communication with the central decomposition and conversion chamber for introducing a gaseous waste stream therein, thermal means for decomposing and converting the gaseous waste stream into reaction products, and means for introducing a fluid into the interior space. The interior porous wall may be adapted to allow transference of the fluid from the interior space into the central decomposition and conversion chamber at a sufficient force to reduce deposition of reaction products on the interior porous wall. The interior porous wall may also be positioned from the outer exterior wall a sufficient distance to define an interior space.

The lower reaction chamber may include a gas flow chamber in fluid communication with the central decomposition and conversion chamber. The gas flow chamber may include an inlet and an outlet for passing the gaseous waste stream and reaction products therethrough. The lower reaction chamber may also include means for generating a downwardly flowing liquid film on interior surfaces of the gas flow chamber. The downwardly flowing liquid film may reduce deposition and accumulation of particulate solids on the lower reaction chamber. In some embodiments, a water fall and/or spray jets may be employed to create the downwardly flowing liquid film.

The interior space positioned between the outer exterior wall and the interior porous wall may be an interior annular space. The means for introducing a fluid into the interior space may be adapted to introduce pressurized fluid into the interior annular space. The means for introducing a fluid into the interior space may be adapted to introduce water, steam, air, clean dry air, clean enriched air, oxygen enriched air, oxygen depleted air (e.g., air with a lower than atmospheric percentage of oxygen), inert gas (e.g., $N_2$), depleted air or inert gas, and/or mixtures thereof. The means for introducing a fluid into the interior space may alternatively be adapted to introduce water alone or air alone. In some embodiments, the means for introducing a fluid into the interior space may be adapted to introduce fluid into the interior space under pulsing conditions. The means for introducing a fluid into the interior space may also be adapted to inject fluid into the central decomposition and conversion chamber under periodic pulsing. In some embodiments, the pulsing conditions may use a pulsation duration of from about 3 ms to 1 second.

The two-stage reactor may be adapted such that the lower reaction chamber includes at least one oxidant inlet positioned to introduce an oxidant to the gas flow chamber. The two-stage reactor may also include at least one additional gas inlet for introducing a combustible fuel, reactants, and/or an oxidant for mixing with the gaseous waste stream. The reactor may also include a combustible fuel supply coupled to the at least one additional gas inlet, wherein the combustible fuel supply is adapted to supply oxygen, city gas, LPG, propane, methane, and/or hydrogen.

In some embodiments, the means for introducing a fluid into the interior space includes a liquid vortex positioned near the inlet of the gas flow chamber. The liquid vortex may include an outer shell having a top plate with a central opening in fluid communication with the central decomposition and conversion chamber. There may be a conical-shaped baffle within the outer shell having an inner surface and a central opening which is generally aligned with the interior surface of the gas stream flow chamber. The conical-shaped baffle may be generally concentrically aligned with the inner surface of the outer shell to form a concentric chamber. The liquid vortex may also include a liquid inlet arranged to tangentially introduce liquid into the concentric chamber. The liquid may be introduced such that the concentric chamber is filled with liquid to create a swirling motion so that the liquid rises and overflows the conical-shaped baffle and forms a sheet of fluid on the inner surface of the conical-shaped baffle that flows downwardly onto the interior surface of the gas stream flow chamber. The sheet of fluid on the inner surface of the conical-shaped baffle may inhibit an entering gas stream from contacting the interior surface of the gas stream flow chamber thereby resisting deposition of reaction products thereon.

In some embodiments, the interior porous wall may be fabricated of a material that includes ceramic, sintered ceramic, sintered metal, porous metal material, a porous polymeric material, glass, and/or blends and/or combinations thereof The interior porous wall may include pores uniformly distributed in the porous material. In other embodiments, the pores may be distributed with a varying density including on a gradient.

In some embodiments, the outer exterior wall and the interior porous wall may be separated by a sufficient distance to provide an annular space and for distributing a pressured gas for passage through the interior porous wall. The reaction chamber may operate at a pressure that is lower than atmospheric pressure.

The interior porous wall may include a plurality of apertures for passage of a pressurized gas through the interior porous wall into the central decomposition and conversion chamber. The plurality of apertures may include conical shaped protuberances.

The means for introducing a fluid into the interior space may be adapted to introduce fluid that is compressed to a suitable pressure to facilitate pulsating ejection of the fluid with a force sufficient to reduce particle deposition on the inner surface of the central decomposition and conversion chamber. In some embodiments, the pressure may be from about 60 psig to about 100 psig.

In some embodiments, the invention may include an abatement system for controlled decomposition and conversion of gaseous pollutants in a gaseous waste stream. The system may include an upper thermal reaction chamber and a lower reaction chamber. The upper thermal reaction chamber may include an outer exterior wall, an interior porous wall that defines a central decomposition and conversion chamber, means for introducing a fluid to the interior annular space, thermal means for decomposing and converting the gaseous waste stream to form reaction products, and at least one waste gas inlet for conducting the gaseous waste stream into the upper thermal reactor. The interior porous wall may be positioned from the outer exterior wall a sufficient distance to define an interior annular space.

The lower reaction chamber may include a gas flow chamber in fluid communication with the central decomposition and conversion chamber, and at least one oxidant inlet positioned to introduce an oxidant to the gas stream flow chamber.

The waste gas inlet may include a conduit that terminates within the central decomposition and conversion chamber. The portion of the conduit that terminates within the central decomposition and conversion chamber may be located within a tube which projects beyond the end of the conduit to define a chamber within the tube for flame formation. The tube may have an open end in fluid communication with the central decomposition and conversion chamber.

The lower reaction chamber may include a liquid vortex positioned between the central decomposition and conversion chamber and the gas flow chamber. The liquid vortex may include an outer shell with a top plate, a conical-shaped baffle within the outer shell, and a liquid inlet. The outer shell may include a central opening in fluid communication with the central decomposition and conversion chamber. The conical-shaped baffle within the outer shell may include an inner surface and a central opening which is generally aligned with the interior surface of the gas stream flow chamber. The conical-shaped baffle may generally be concentrically aligned with the inner surface of the outer shell to form a concentric chamber. The liquid inlet may be arranged to tangentially introduce liquid into the concentric chamber. The liquid may be introduced so as to fill the concentric chamber with liquid, creating a swirling motion, and causing the liquid to rise and overflow the conical-shaped baffle into the gas stream flow chamber. The overflowing liquid may thus form a sheet of fluid on the inner surface of the conical-shaped baffle that flows downwardly onto the interior surface of the gas stream flow chamber.

The interior porous wall may provide for transference of the fluid from the interior annular space into the central decomposition and conversion chamber at a sufficient force to reduce deposition of reaction products on the interior porous wall. The interior porous wall may have a porosity of less than about 20%.

In some embodiments, the means for introducing a fluid to the interior annular space may be adapted to introduce pressurized fluid into the annular space. The means for introducing a fluid may be adapted to introduce fluid including water, steam, air, clean dry air, clean enriched air, oxygen enriched air, oxygen depleted air (e.g., air with a lower than atmospheric percentage of oxygen), inert gas (e.g., $N_2$), depleted air or inert gas, and/or mixtures thereof. The means for introducing a fluid into the interior space may alternatively be adapted to introduce water alone or air alone. For example, the means for introducing a fluid to the interior annular space may be adapted to inject steam through the interior porous wall. In addition, the means for introducing a fluid to the interior annular space may be adapted to introduce fluid under pulsing conditions.

In some embodiments, a fluid deliver system or other means for introducing a fluid to the interior annular space may be adapted to provide at least one of water, steam, air, clean dry air, clean enriched air, oxygen enriched air, oxygen depleted air, inert gas, a reagent, an oxidizer and depleted air. In one or more embodiments, the fluid delivery system or other means may be adapted to provide at least one of ozone, hydrogen peroxide and ammonia.

The abatement system may further include one or more additional gas inlets for introducing a combustible fuel, reactants, and/or an oxidant for mixing with the gaseous waste stream. The abatement system may also include a combustible fuel supply coupled to the at least one additional gas inlet. The combustible fuel supply may be adapted to supply oxygen, butane, ethanol, LPG, city gas, natural gas, propane, methane, hydrogen, 13A and/or mixtures thereof.

The invention may also include methods for controlled decomposition and conversion of gaseous pollutants in a gaseous waste steam in a two-stage thermal reactor. The methods may include introducing the gaseous waste stream to an upper thermal reactor through at least one waste gas inlet, providing at least one combustible fuel for mixing with the gaseous waste stream to form a fuel rich combustible gas stream mixture, igniting the fuel rich combustible gas stream mixture in a decomposition and conversion chamber to effect formation of reaction products, injecting an additional fluid into the decomposition and conversion chamber through a porous wall of the decomposition and conversion chamber contemporaneously with the decomposing and converting of the fuel rich combustible gas stream mixture, wherein the additional fluid is injected at a force exceeding that of reaction products approaching an interior surface of the decomposition and conversion chamber thereby inhibiting deposition of the reaction products thereon, flowing the reaction products into a lower reaction chamber, flowing water along a portion of an interior surface of the lower reaction chamber, and flowing the reaction products through the portion of the lower reaction chamber, wherein the flowing water inhibits deposition of the reaction products on the interior surface of the lower reaction chamber.

In some embodiments, injecting an additional fluid into the decomposition and conversion chamber through a porous wall of the decomposition and conversion chamber may include pulsing the additional fluid through the porous wall. The methods may further include introducing an air containing gas into the reaction products so as to form a fuel lean mixture. Flowing water along a portion of an interior surface of the lower reaction chamber may include employing a water vortex.

The invention may further include an apparatus for use during the abatement of a semiconductor manufacturing process. The apparatus may include a thermal reaction chamber with an interior porous wall that defines a central decomposition and conversion chamber, at least one waste gas inlet in fluid communication with the central decomposition and conversion chamber and adapted to introduce a gaseous waste stream to the central decomposition and conversion chamber, a thermal mechanism positioned within the central decomposition and conversion chamber and adapted to combust the gaseous waste stream within the central decomposition and conversion chamber, thereby forming reaction products; and a fluid delivery system adapted to provide a fluid to the central decomposition and conversion chamber through the interior porous wall at a sufficient force to reduce deposition of reaction products on an inner surface of the interior porous wall of the central decomposition and conversion chamber.

The apparatus may further include an outer wall that surrounds the interior porous wall and that defines an interior space between the outer wall and the interior porous wall. The fluid delivery system may be adapted to provide a fluid to the central decomposition and conversion chamber through the interior porous wall by providing fluid to the interior space between the outer wall and the interior porous wall. The central decomposition and conversion chamber may be cylindrical. The fluid delivery system may be adapted to provide water, air, clean dry air, depleted air and/or clean enriched air to the central decomposition and conversion chamber through the interior porous wall. The fluid delivery system may also be adapted to provide fluid to the central decomposition and conversion chamber through the interior porous wall by pulsing the fluid. The pulsing may be periodic. The fluid delivery system may be adapted to provide fluid to the central decomposition and conversion chamber through the interior porous wall at a pressure of less than about 600 psig and, in some embodiments, at a pressure less than about 100 psig. In some embodiments, the fluid delivery system may be adapted to provide a fluid at a pressure of about 50 psig to about 100 psig, about 5 psig to about 50 psig, or about $1/10$ psig to about 5 psig. Other pressure ranges may be used.

The fluid delivery system may be adapted to provide a fluid to the central decomposition and conversion chamber through the interior porous wall so as to form a non-deposition zone adjacent the interior surface of the central decomposition and conversion chamber. The fluid delivery system may also include a plurality of inlets adapted to deliver fluid along a length of an exterior surface of the interior porous wall.

The interior porous wall may include pores shaped so as to provide passage of fluid into the central decomposition and conversion chamber while reducing backflow of any fluid or reaction products from the central decomposition and conversion chamber. In some embodiments, the interior porous wall may include a porous ceramic. The wall may include pores shaped so as to provide passage of fluid into the central decomposition and conversion chamber while reducing backflow of any fluid or reaction products from the central decomposition and conversion chamber.

The thermal reaction chamber may include a plurality of waste gas inlets. For example, the thermal reaction chamber may include at least four or six waste gas inlets. The inlets may be angled and/or directed so as to introduce turbulent flow to prevent deposition on the sidewalls of the chamber.

The apparatus may further include a second reaction chamber coupled to the thermal reaction chamber. The second reaction chamber may include a gas flow chamber in fluid communication with the central decomposition and conversion chamber. The gas flow chamber may have an inlet and outlet for passing the gaseous waste stream and reaction products through the gas flow chamber. In some embodiments, the second reaction chamber may also include a water delivery system adapted to generate a flowing liquid film on an interior surface of the gas flow chamber so as to reduce deposition and accumulation of particulate solids on the interior surface of the gas flow chamber.

The water delivery system may be adapted to cool the interior surface of the gas flow chamber. In some embodiments, the water delivery system may be adapted to generate a vortex of cooling water. In some embodiments, the second reaction chamber may be located below the thermal reaction chamber. The second reaction chamber may also include at least one inlet adapted to introduce an oxidant to the gaseous waste stream.

The invention may be embodied as an apparatus for use during the abatement of a semiconductor manufacturing process. The apparatus may include an upper reaction chamber and a lower reaction chamber. The upper reaction chamber may include an interior porous wall that defines a central decomposition and conversion chamber, an outer wall that surrounds the interior porous wall and that defines an interior space between the outer wall and the interior porous wall, at least one waste gas inlet in fluid communication with the central decomposition and conversion chamber and adapted to introduce a gaseous waste stream to the central decomposition and conversion chamber, a thermal mechanism positioned within the central decomposition and conversion chamber and adapted to combust the gaseous waste stream within the central decomposition and conversion chamber to thereby form reaction products, and a fluid delivery system adapted to provide a fluid to the central decomposition and conversion chamber through the interior porous wall at a sufficient force to reduce deposition of reaction products on an inner surface of the interior porous wall of the central decomposition and conversion chamber.

The lower reaction chamber may be coupled to the upper reaction chamber. The lower reaction chamber may include a gas flow chamber in fluid communication with the central decomposition and conversion chamber, the gas flow chamber having an inlet and outlet for passing the gaseous waste stream and reaction products through the gas flow chamber. The lower reaction chamber may also include a water delivery system adapted to generate a flowing liquid film on an interior surface of the gas flow chamber so as to reduce deposition and accumulation of particulate solids on the interior surface of the gas flow chamber. The lower reaction chamber may also include an inlet adapted to introduce an oxidant to the gaseous waste stream.

The invention may also include a replaceable liner for a thermal reaction chamber. The replaceable liner may be modular, porous, and constructed of ceramic or other similar materials. The porous ceramic liner may have a shape that defines a central decomposition and conversion chamber for use during decomposition and conversion of gaseous waste from a semiconductor manufacturing process. The porous ceramic liner or wall may have sufficient porosity to allow transfer of fluid from outside the porous ceramic wall, through the porous ceramic wall, and into the central decomposition and conversion chamber during a decomposition and conversion process performed within the central decomposition and conversion chamber so as to reduce movement of reaction products toward an interior surface of the porous ceramic wall or liner.

In some embodiments, the porous ceramic wall/liner may include pores shaped so as to provide passage of fluid into the central decomposition and conversion chamber defined by the porous ceramic wall while reducing backflow of any fluid or reaction products from the central decomposition and conversion chamber. The porous ceramic wall may include ceramic, sintered ceramic, $MgAl_2O_4$, $Al_2O_3$, SiC, MgO, and/or any combination thereof.

The invention may alternatively include a porous material wall having a shape that defines a central decomposition and conversion chamber for use during decomposition and conversion of gaseous waste from a semiconductor manufacturing process. The porous material wall may have sufficient porosity to allow transfer of fluid from outside the porous material wall through the porous material wall and into the central decomposition and conversion chamber during a decomposition and conversion process performed within the central decomposition and conversion chamber so as to reduce movement of reaction products toward an interior surface of the porous material wall. The porous material wall may comprise a sintered ceramic, sintered metal, porous metal material, a porous polymeric material, and/or a combination thereof.

Although the invention has been variously described herein with reference to illustrative embodiments and features, it will be appreciated that the embodiments and features described hereinabove are not intended to limit the invention, and that other variations, modifications and other embodiments will readily suggest themselves to those of ordinary skill in the art, based on the disclosure herein. The invention therefore is to be broadly construed, consistent with the claims hereafter set forth.

The invention claimed is:

1. A thermal reactor for use during the abatement of a semiconductor manufacturing process comprising:
    a thermal reaction unit having:
        an interior porous wall that defines a central chamber, the interior porous wall formed from a plurality of stacked porous sections;
        at least one gas inlet in fluid communication with the central chamber and adapted to introduce a gaseous waste stream to the central chamber;
        a thermal mechanism positioned within the central chamber and adapted to decompose the gaseous waste stream within the central chamber, thereby forming reaction products; and
        a fluid delivery system adapted to provide a fluid to the central chamber through the interior porous wall at a sufficient force to reduce deposition of reaction products on an inner surface of the interior porous wall of the central chamber;
    wherein at least one of the porous sections has one or more of:
        a property that varies within the porous section; and
        a property that differs from a property of at least one other porous section of the interior porous wall.

2. The thermal reactor of claim 1 wherein the thermal reaction unit is formed from at least eight porous ceramic rings.

3. The thermal reactor of claim 1 wherein the thermal reaction unit is formed from about eleven porous ceramic rings.

4. The thermal reactor of claim 1 wherein the porous sections have a shape selected from the group consisting of round, elliptical, triangular, square, rectangular, polygonal, pentagonal, hexagonal and octagonal.

5. The thermal reactor of claim 1 wherein the porous sections are selected from the group consisting of stackable washers, chevrons and rings.

6. The thermal reactor of claim 1 wherein at least one of the porous sections comprises a non-rigid material.

7. The thermal reactor of claim 1 wherein at least one of the porous sections has a graded coefficient of thermal expansion (CTE).

8. The thermal reactor of claim 7 wherein at least one of the porous sections comprises yttria doped aluminum fiber.

9. The thermal reactor of claim 8 wherein at least one of the porous sections has a CTE that increases from a top to a bottom of the porous section.

10. The thermal reactor of claim 8 wherein at least one of the porous sections has a CTE that increases from an inside to an outside of the porous section.

11. The thermal reactor of claim 1 wherein at least one of the porous sections has at least one of a pore size, pore shape and pore density that varies within the porous section.

12. The thermal reactor of claim 1 wherein at least one of the porous sections has pores that are at least one of tapered and conical.

13. The thermal reactor of claim 1 wherein at least one of the porous sections has at least one of a composition, dopant type and dopant concentration that varies within the porous section.

14. The thermal reactor of claim 1 wherein at least one of the porous sections comprises at least one of a ceramic, a sintered ceramic, a sintered metal, a porous metal material, doped aluminum fiber, glass and a porous polymeric material.

15. The thermal reactor of claim 1 wherein at least one of the porous sections comprises at least one of $MgAl_2O_4$, $Al_2O_3$, SiC, and MgO.

16. The thermal reactor of claim 1 wherein at least one of the porous sections comprises a doped ceramic.

17. The thermal reactor of claim 16 wherein at least one of the porous sections comprises a ceramic doped with one or more of yttria, La, Ce, Pr, Nd, Pm, Sm, Eu, Gd, Tb, Dy, Ho, Er, Tm, Yb and Lu.

18. The thermal reactor of claim 1 wherein a first of the porous sections has a first coefficient of thermal expansion (CTE) and a second of the porous sections has a second CTE.

19. The thermal reactor of claim 18 wherein the first porous section is positioned near an inlet of the thermal reaction unit and wherein the first CTE of the first porous section is smaller than the second CTE of the second porous section.

20. The thermal reactor of claim 1 wherein each porous section has a different CTE.

21. The thermal reactor of claim 1 wherein a first of the porous sections has a first purity level and a second of the porous sections has a second purity level.

22. The thermal reactor of claim 21 wherein the first porous section is positioned near an inlet of the thermal reaction unit and wherein the first purity level of the first porous section is greater than the second purity level of the second porous section.

23. The thermal reactor of claim 1 wherein a first of the porous sections has a first doping level and a second of the porous sections has a second doping level.

24. The thermal reactor of claim 1 wherein at least one of a CTE, a purity level and a doping level of each porous section is selected based on a temperature profile within the thermal reaction unit during abatement.

25. The thermal reactor of claim 1 wherein at least one of a CTE, a purity level and a doping level of each porous section is selected so that expansion of each porous section is approximately equal within the thermal reaction unit during abatement.

* * * * *

UNITED STATES PATENT AND TRADEMARK OFFICE
CERTIFICATE OF CORRECTION

| | | |
|---|---|---|
| PATENT NO. | : 7,736,600 B2 | |
| APPLICATION NO. | : 11/555056 | |
| DATED | : June 15, 2010 | |
| INVENTOR(S) | : Daniel O. Clark | |

It is certified that error appears in the above-identified patent and that said Letters Patent is hereby corrected as shown below:

Column 20, line 33, "8. The thermal reactor of claim 7 wherein at least one of the" should be changed to "8. The thermal reactor of claim 1 wherein at least one of the"

Column 20, line 35, "9. The thermal reactor of claim 8 wherein at least one of the" should be changed to "9. The thermal reactor of claim 7 wherein at least one of the"

Column 20, line 38, "10. The thermal reactor of claim 8 wherein at least one of" should be changed to "10. The thermal reactor of claim 7 wherein at least one of"

Signed and Sealed this

Thirteenth Day of September, 2011

David J. Kappos
*Director of the United States Patent and Trademark Office*